(12) United States Patent
Tsuji et al.

(10) Patent No.: US 6,826,215 B2
(45) Date of Patent: Nov. 30, 2004

(54) LASER DIODE DRIVING CIRCUIT

(75) Inventors: Nobuaki Tsuji, Hamamatsu (JP);
Kunito Takahashi, Hamamatsu (JP)

(73) Assignee: Yamaha Corporation, Hamamatsu (JP)

( * ) Notice: Subject to any disclaimer, the term of this patent is extended or adjusted under 35 U.S.C. 154(b) by 246 days.

(21) Appl. No.: 09/789,975

(22) Filed: Feb. 21, 2001

(65) Prior Publication Data
US 2003/0189961 A1 Oct. 9, 2003

(30) Foreign Application Priority Data
Feb. 22, 2000 (JP) ........................................ 2000-045000

(51) Int. Cl.[7] .............................. H01S 3/13; H01S 3/00
(52) U.S. Cl. ................................ 372/38.02; 372/38.03; 372/38.07; 372/29.015
(58) Field of Search ...................... 372/38.02, 38.03, 372/38.07, 29.015, 29.016, 29.023, 25, 26, 29.1; 315/327

(56) References Cited

U.S. PATENT DOCUMENTS 5,315,606 A * 5/1994 Tanaka ........................ 372/38
5,798,658 A * 8/1998 Werking ....................... 326/83
5,991,320 A * 11/1999 Nakayama ............... 372/38.02

FOREIGN PATENT DOCUMENTS

| JP | 6139761 | 9/1986 |
| JP | 4283978 | 10/1992 |
| JP | 734491 | 4/1995 |
| JP | 01261827 | 9/1998 |

* cited by examiner

Primary Examiner—Minsun Oh Harvey
Assistant Examiner—Armando Rodriguez
(74) Attorney, Agent, or Firm—Pillsbury Winthrop LLP

(57) ABSTRACT

A laser diode driving circuit is provided, which is capable of supplying a laser diode thereof with a high-speed pulse current. A current source supplies a current to the laser diode. An NMOS transistor as a first switch is connected between the current source and the laser diode. An NMOS transistor as a second switch is connected between a junction between the current source and the first switch and a pseudo load. A controller supplies a first voltage pulse signal to the first switch and a second voltage pulse signal opposite in phase to the first voltage pulse signal to the second switch to switch the first and second switches in a complementary manner.

14 Claims, 19 Drawing Sheets

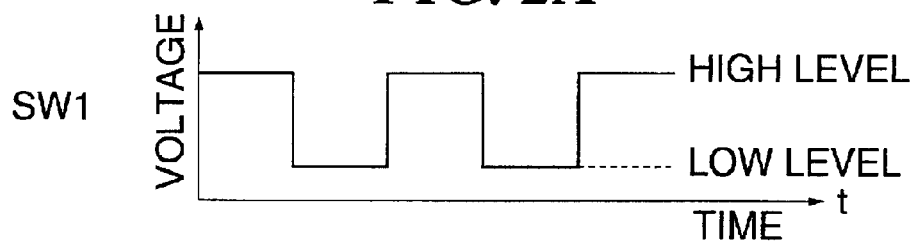
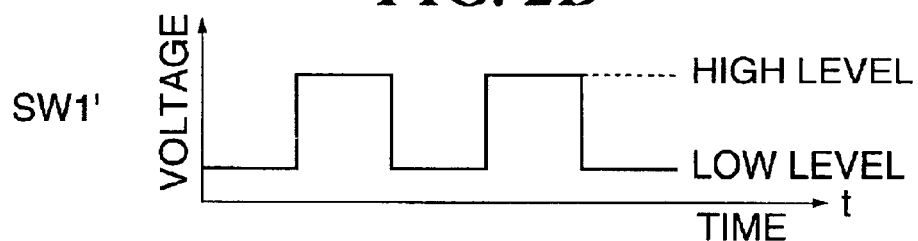
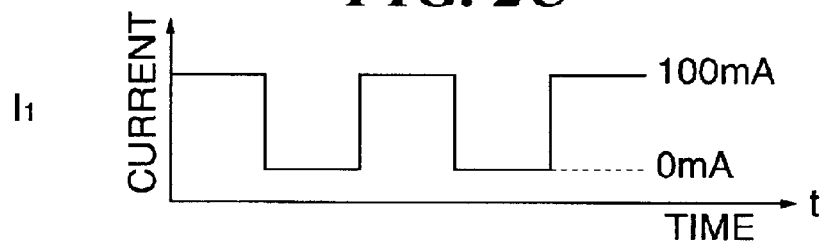
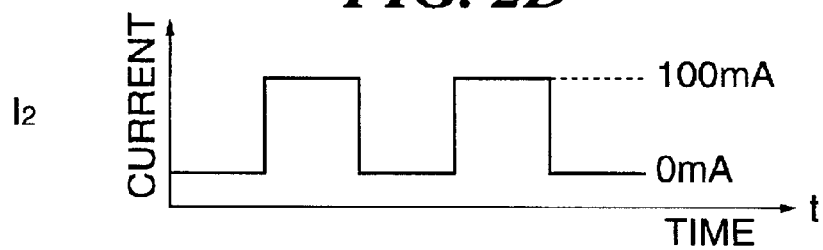
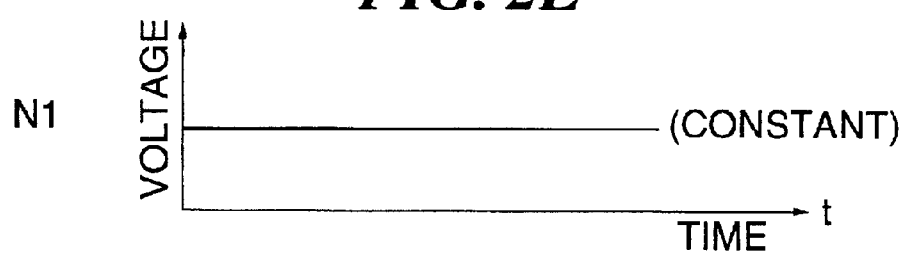

SW1

I₁

LASER DIODE DRIVING CIRCUIT

BACKGROUND OF THE INVENTION

1. Field of the Invention

The present invention relates to a laser diode driving circuit that drives laser diodes used as light sources for recording/reproducing or the like in optical communications, laser printers, CDs (Compact Disks), DVDs (Digital Versatile Disks) or the like.

2. Prior Art

When a laser diode is used as a light source for the recording/reproducing or the like in optical communications, laser printers, CDs, DVDs or the like, a pulse current flowing through the laser diode is as large as tens to hundreds of milliamperes, and is switched at high speed (specifically, at a rise/fall time of 1 nsec or less). FIGS. 16 and 18 show an example of the configuration of essential parts of a conventional laser diode driving circuit. The conventional laser diode driving circuit shown in FIG. 16 is arranged such that a current source 100 is connected to a laser diode 102 through a switching element 101, and this element 101 is driven to supply the laser diode 102 with a desired pulse current.

Further, another conventional laser diode driving circuit shown in FIG. 18 is designed such that a first current source 200 is directly connected to an anode of a laser diode 201, and a series circuit consisting of a second current source 203 for current sinking and a pseudo load 204 is connected to a junction or node between the first current source 200 and the laser diode 201 through a switching element 202, and this element 202 is driven to supply the laser diode 202 with a pulse current. The second current source 203 supplies an output current whose value is different from that supplied from the first current source 200.

The conventional laser diode driving circuits shown in FIGS. 16 and 18 will be described specifically. The laser diode driving circuit shown in FIG. 16 has a main part comprised of the current source 100 that supplies the laser diode 102 with a 100 mA current, and an NMOS transistor 101 functioning as the switching element connected between an anode of the laser diode 102 and the current source 100.

In the above configuration, as shown in FIG. 17A, for example, a 100 MHz pulse voltage signal is applied to a gate of the NMOS transistor 101 to switch the transistor 101. As a result, a current pulse whose height is 100 mA is generated at a node OUT1 and flows into the laser diode (FIG. 17B).

However, the potential at a node N1, which is a junction between the current source 100 and the NMOS transistor 101, increases to a level near a source voltage Vdd when the NMOS transistor 101 turns off, and hence this potential does not drop from such level near the source voltage Vdd immediately when the NMOS transistor 101 turns on again (FIG. 17C). As a result, the current pulse generated at the node OUT1 does not respond quickly to the pulse voltage signal (FIG. 17A) applied to the gate of the NMOS transistor 101 as shown in FIG. 17B, and thus the waveform of the current pulse is blunted.

Further, the conventional laser diode driving circuit shown in FIG. 18 has a main part comprised of the first current source 200 that supplies a 100 mA current to the laser diode 201, the NMOS transistor 202 as the switching element whose drain is connected to a junction between the first current source 200 and the laser diode 201, the second current source 203 for current sinking connected to a source of the NMOS transistor 202, for supplying an output current (50 mA) different from that supplied from the first current source 200, and the pseudo load 204 connected to the second current source 203.

In the above configuration, as shown in FIG. 19A, for example, a 100 MHz pulse voltage signal is applied to a gate of the NMOS transistor 202 to switch the transistor 202. As a result, during an on period of the NMOS transistor 202, a 50 mA current I2 flows from the first current source 200 into the current sinking second current source 203, and further flows to the pseudo load 204. Simultaneously, a 50 mA current I1 flows from the first current source 200 to the laser diode 201. On the other hand, during an off period of the NMOS transistor 202, the current I2 flowing into the second current source 203 assumes 0 mA, whereby the current I1 flowing from the first current source 200 to the laser diode 201 assumes 100 mA (FIGS. 19B and 19C).

When the NMOS transistor 202 is switched from on to off under this condition, the potential at a node OUT2 assumes the ground potential (0 V), and hence the 50 mA current does not flow to the pseudo load 204 immediately even when the NMOS transistor 202 turns on again. As a result, the current I1 flowing into the laser diode 201 cannot respond quickly to the pulse voltage signal (FIG. 19A) applied to the gate of the NMOS transistor 202, and thus the waveform of the current pulse is blunted.

SUMMARY OF THE INVENTION

It is therefore an object of the present invention to provide a laser diode driving circuit which is capable of supplying a laser diode thereof with a high-speed pulse current.

To attain the above object, in a first aspect of the present invention, there is provided a circuit for driving a laser diode, comprising a current source that supplies a current to the laser diode, a first switch connected between the current source and the laser diode, a second switch connected between a junction between the current source and the first switch and a pseudo load, and a controller that supplies a first voltage pulse signal to the first switch and a second voltage pulse signal opposite in phase to the first voltage pulse signal to the second switch to switch the first and second switches in a complementary manner.

According to the above configuration, a constant current always flows through the junction between the current source and the first switch so that the potential at the junction is kept from varying. As a result, the laser diode can be supplied with a high-speed pulse current.

Further, to attain the above object, in a second aspect of the present invention, there is provided a circuit for driving a laser diode having a cathode and an anode, comprising a first current source connected to the anode of the laser diode, the cathode of which is grounded, for supplying an offset current to the laser diode, a second current source that supplies a current for superimposition upon the offset current, a first switch connected between the second current source and the anode of the laser diode, a second switch connected between a junction between the second current source and the first switch and a pseudo load, and a controller that supplies a first voltage pulse signal to the first switch and a second voltage pulse signal opposite in phase to the first voltage pulse signal to the second switch to switch the first and second switches in a complementary manner.

According to the above configuration, a constant current always flows through the junction between the second current source and the first switch so that the potential at the junction is kept from varying. Therefore, the laser diode can be supplied with a high-speed pulse current wherein the current pulse obtained from the current supplied from the second current source by switching the first switch is superimposed upon the offset current from the first current source.

Further, to attain the above object, in a third aspect of the present invention, there is provided a circuit for driving a laser diode having a cathode and an anode, comprising a first current source connected between the anode of the laser diode, the cathode of which is grounded, for supplying an offset current to the laser diode, at least two second current sources each having an output, for supplying currents for superimposition upon the offset current, first switches connected between the outputs of the at least two second current sources and the anode of the laser diode, second switches connected between respective junctions between the outputs of the at least two current sources and the first switches and a pseudo load, and a controller that controls driving of the first and second switches such that the laser diode is supplied with a current obtained by superimposing a pulse current signal upon at least the offset current as a reference level, and such that amplitude of the pulse current signal is variable.

According to the above configuration, a constant current always flows through the junctions (nodes) between the respective outputs of the two or more second current sources and the first and second switches, whereby the potential at the nodes can be kept from varying. Therefore, the current supplied to the laser diode can be controlled such that the pulse current signal is superimposed upon at least the offset current as a reference level and such that the amplitude of the pulse current signal is variable.

Preferably, in the laser diode driving circuit according to the third aspect, the controller controls driving of the first and second switches such that the laser diode is supplied with a current obtained by first superimposing a second offset current upon a level of the offset current to obtain an offset current as a second reference level which is increased by the superimposition, and then superimposing a pulse current signal upon the offset current as the second reference level.

According to this configuration, in addition to the above-mentioned effects obtained by the third aspect, the current supplied to the laser diode can be controlled such that the offset current is variable and the pulse voltage signal is superimposed upon this offset current.

Further, to attain the above object, in a fourth aspect of the present invention, there is provided a circuit for driving a laser diode having a cathode and an anode, comprising a first current source having an output thereof connected to the anode of the laser diode, the cathode of which is grounded, for supplying an offset current to the laser diode, a second current source that supplies an output current whose value is different from that of an output current supplied from the first current source, a current mirror circuit having a first transistor for sinking the output current from the second current source, and a second transistor driven by the first transistor, a switch connected between the second transistor and a junction between the output of the first current source and the anode of the laser diode, and a controller that supplies a voltage pulse signal to the switch.

According to the configuration of the fourth aspect, a constant current always flows through the junction between the output of the first current source and the anode of the laser diode, whereby the potential at the node can be kept from varying. Therefore, by causing the switch to intermittently shunt a predetermined amount of the output current from the first current source to the current mirror circuit using the offset current from the first current source as a reference, a high-speed pulse current is obtained, and hence the laser diode can be supplied with such a high-speed pulse current.

Further, to attain the above object, a fifth aspect of the present invention provides a circuit for driving a laser diode having a cathode and an anode, comprising a first current source connected to the anode of the laser diode, the cathode of which is grounded, for supplying an offset current to the laser diode, a second current source having an output, for supplying an output current whose value is different from that of an output current supplied from the first current source, a current mirror circuit having a first transistor for sinking the output current from the second current source, and a second transistor driven by the first transistor, a first switch connected between the output of the second current source and the first transistor, a second switch connected between the output of the second current source and the second transistor, the first current source having an output thereof connected to a junction between the second switch and the second transistor, and a controller that controls driving of the first and second switches so as to switch in a complementary manner.

According to the above configuration, the laser diode can be supplied with a high-speed pulse current, and the amplitude of the current supplied to the laser diode can be varied with respect to a central value thereof which is fixed.

Preferably, in the laser diode driving circuit according to the fifth aspect, the circuit for driving a laser diode further comprises a third switch connected between the output of the second current source and the first and second switches, and a fourth switch connected to the first and second transistors constituting the current mirror circuit, and wherein the controller drives the third switch to block current supply to the first and second switches, and drives the fourth switch to forcibly turn off the first and second transistors, to limit a current supplied to the laser diode only to the offset current from the first current source.

According to this configuration, in the laser diode driving circuit according to the fifth aspect, in addition to the above-mentioned effects obtained by the fifth aspect, the influence of the operation performed by the current mirror circuit can be blocked quickly when the current supplied to the laser diode is limited only to the offset current from the first current source.

Further preferably, in the laser diode driving circuit according to the fifth aspect, the circuit for driving a laser diode further comprises a fourth switch connected to the first and second transistors constituting the current mirror circuit, and a fifth switch connected between the output of the second current source and a pseudo load, and wherein the controller drives the fourth switch to forcibly turn off the first and second transistors, and turn on the fifth switch to cause the output current from the second current source to flow to the pseudo load, to limit a current supplied to the laser diode only to the offset current from the first current source.

According to this configuration, a constant current always flows through the junction between the second current source and the first and second switches, and hence the potential at this junction can be kept from varying. Thus, a high response can be implemented in switching from the operating state of limiting the current supplied to the laser diode only to the offset current from the first current source to the operating state of generating a pulse current either by superimposing the current from the second current source upon the offset current through the operations of the first and second switches and the current mirror circuit, or by shunting a portion of the offset current which is equal in value to the current from the second current source, to the current mirror circuit.

Further, preferably, in the laser diode driving circuit according to any of the first to fifth aspects, the first and second transistors and/or the first and second switches are formed of MOS transistors.

According to this configuration, the laser diode driving circuit according to any of the first to fifth aspects can be formed on a CMOS semiconductor integrated circuit.

The above and other objects of the present invention will become more apparent from the following detailed description taken in conjunction with the accompanying drawings.

BRIEF DESCRIPTION OF THE DRAWINGS

FIGS. 2A to 2E collectively form a timing chart showing the operating states of various parts of the laser diode driving circuit shown in FIG. 1;

DETAILED DESCRIPTION OF PREFERRED EMBODIMENTS

The present invention will now be described in detail with reference to the drawings showing embodiments thereof.

Figure 1:
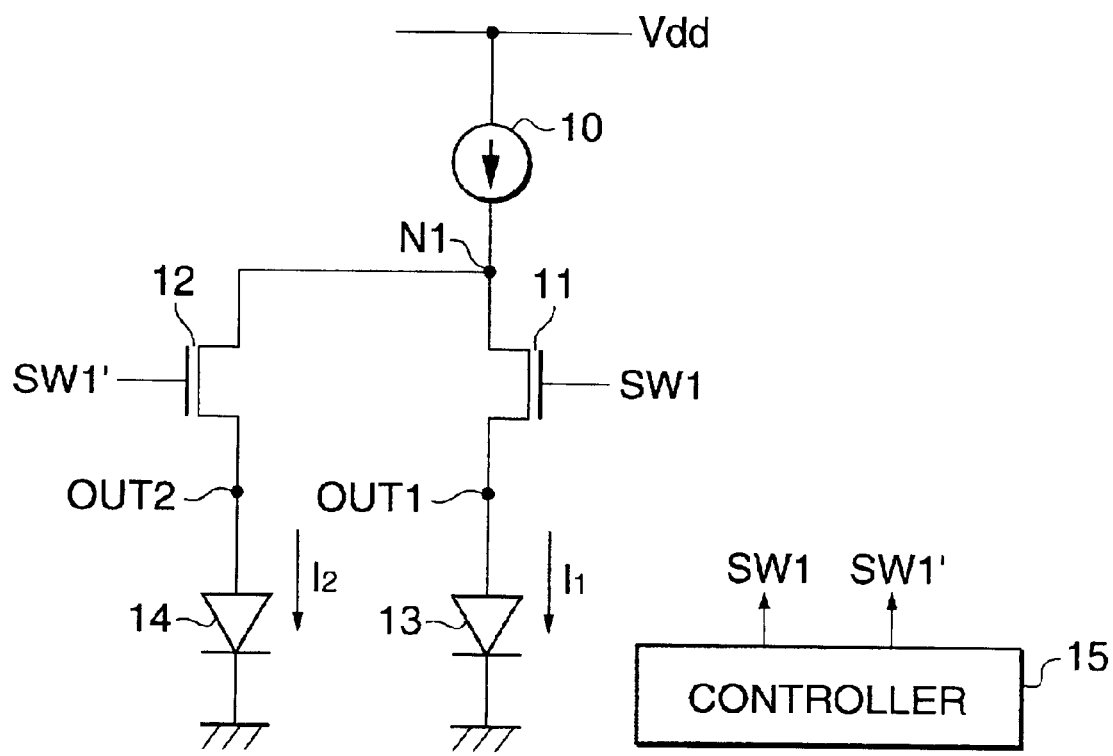
FIG. 1 is a circuit diagram showing the configuration of a laser diode driving circuit according to a first embodiment of the present invention.

FIG. 1 shows the configuration of a laser diode driving circuit according to a first embodiment of the present invention. In the figure, the laser diode driving circuit according to this embodiment is comprised of a current source 10 that supplies a current to a laser diode 13, an NMOS transistor 11 as a first switch connected between the current source 10 and the laser diode 13 and driven by a first voltage pulse signal SW1, an NMOS transistor 12 as a second switch connected between a node N1, which is a junction between the current source 10 and NMOS transistor 11, and a pseudo load 14 and driven by a second voltage pulse signal SW1' opposite in phase to the first voltage pulse signal SW1, and a controller 15 that supplies the voltage pulse signals SW1, SW1' to the NMOS transistors 11, 12, respectively.

An input of the current source 10 is connected to a power line supplying a source voltage Vdd, and an output thereof is connected to drains of the NMOS transistors 11, 12. A source of the NMOS transistor 11 is connected to an anode of the laser diode 13, and a cathode of the laser diode 13 is grounded. A source of the NMOS transistor 12 is grounded through the pseudo load 14 having a DC resistance substantially equal to that of the laser diode 13.

The output current from the current source 10 is 100 mA, a node OUT1 is a junction between the NMOS transistor 11 and the laser diode 13, and a node OUT2 is a junction between the NMOS transistor 12 and the pseudo load 14.

In the above configuration, as shown in FIGS. 2A and 2B, when the first voltage pulse signal SW1 is applied to a gate of the NMOS transistor 11, and the second voltage pulse signal SW1' opposite in phase to the signal SW1 is applied to a gate of the NMOS transistor 12, the NMOS transistors 11, 12 start to be switched alternately by the first and second voltage pulse signals SW1, SW1', whereby the laser diode 13 and the pseudo load 14 are alternately supplied with the 100 mA pulse current from the current source 10 (FIGS. 2C and 2D).

In the illustrated embodiment, either one of the NMOS transistors 11, 12 turns on throughout their switching period, whereby the constant 100 mA current always flows through the node N1, keeping the potential at the node N1 from varying (FIG. 2E). Therefore, the NMOS transistors 11, 12 are switched respectively by the first and second voltage pulse signals SW1, SW1', quickly in a complementary manner, and the resulting on/off operation of the NMOS transistor 11 generates a high-speed pulse current at the node OUT1, whereby the laser diode 13 can be supplied with the high-speed pulse current.

As described above, the laser diode driving circuit according to the first embodiment of the present invention is comprised of the current source 10 that supplies a current to the laser diode 13, the NMOS transistor 11 as the first switch connected between the current source 10 and the laser diode 13 and driven by the first voltage pulse signal SW1, and the NMOS transistor 12 as the second switch connected between the node N1, which is a junction between the current source 10 and the NMOS transistor 11, and the pseudo load 14 and driven by the second voltage pulse signal SW1' opposite in phase to the first voltage pulse signal. This causes a constant current to flow through the node N1 at all times, keeping the potential at the node N1 from varying, and hence the laser diode 13 can be supplied with a high-speed pulse current.

Figure 3:
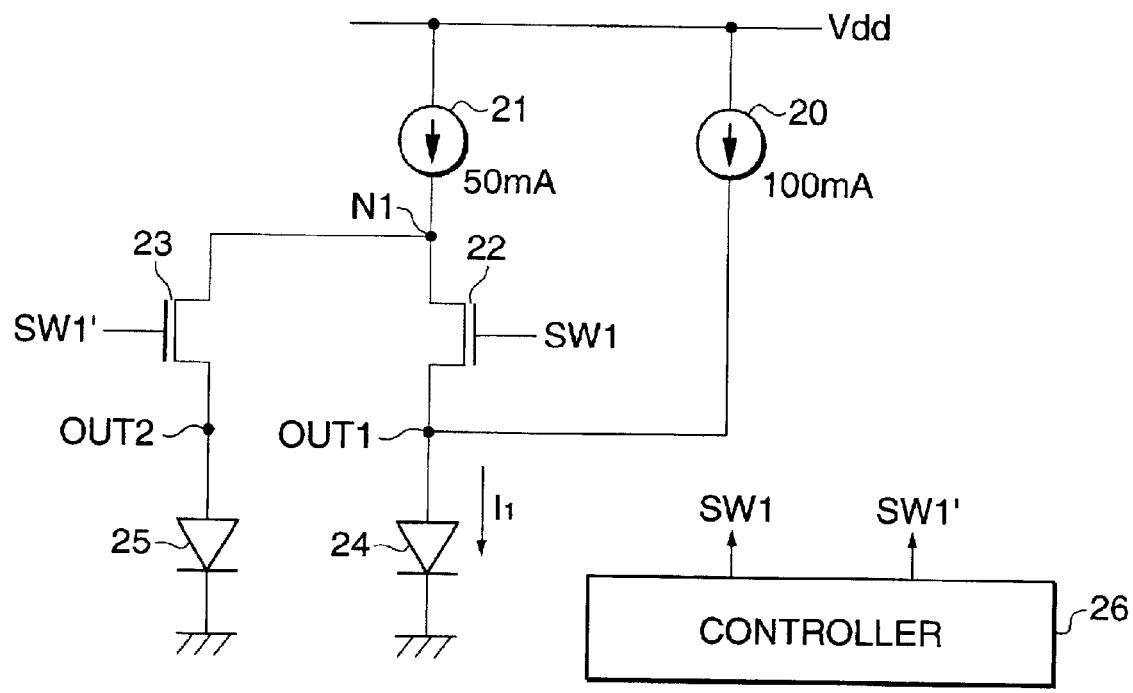
FIG. 3 is a circuit diagram showing the configuration of a laser diode driving circuit according to a second embodiment of the present invention.

Next, FIG. 3 shows the configuration of a laser diode driving circuit according to a second embodiment of the present invention. In the figure, the laser diode driving circuit according to this embodiment is comprised of a first current source 20 connected to an anode of a laser diode 24 whose cathode is grounded, for supplying an offset current to the laser diode 24, a second current source 21 that supplies a current for superimposition upon the offset current, an NMOS transistor 22 as a first switch connected between the second current source 21 and the anode of the laser diode 24 and driven by a first voltage pulse signal SW1, an NMOS transistor 23 as a second switch connected between a node N1, which is a junction between the second current source 21 and the NMOS transistor 22 as the first switch, and a pseudo load 25 and driven by a second voltage pulse signal SW1' opposite in phase to the first voltage pulse signal SW1, and a controller 26 that applies the voltage pulse signals SW1, SW1' to the NMOS transistors 22, 23, respectively.

Inputs of the current sources 20, 21 are each connected to a power line supplying a source voltage Vdd, and an output of the current source 20 is connected to the anode of the laser diode 24. Drains of the NMOS transistors 22, 23 are connected to an output of the current source 21, and a source of the NMOS transistor 22 is connected to the anode of the laser diode 24. Further, a source of the NMOS transistor 23 is grounded through the pseudo load 25.

The output current from the current source 20 is 100 mA, and that from the current source 21 is 50 mA. A node OUT1 is a junction between the NMOS transistor 22 and the laser diode 24, and a node OUT2 is a junction between the NMOS transistor 23 and the pseudo load 25.

Figure 4A:
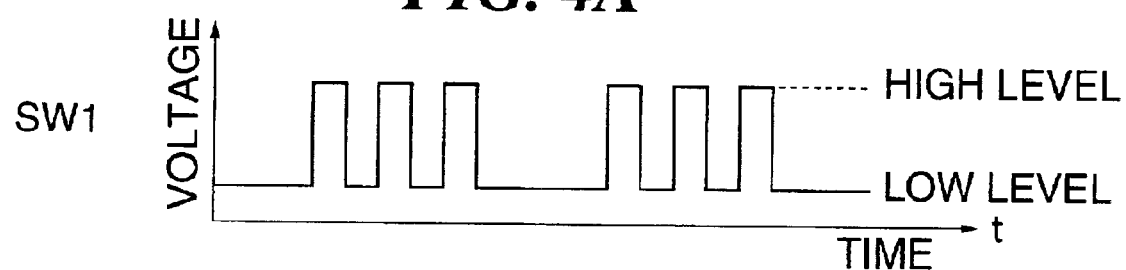
FIGS. 4A to 4D collectively form a timing chart showing the operating states of various parts of the laser diode driving circuit shown in FIG. 3.
Figure 4B:
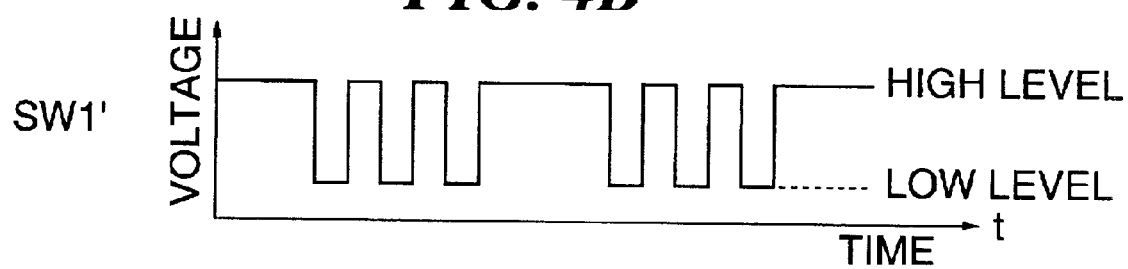
Figure 4C:
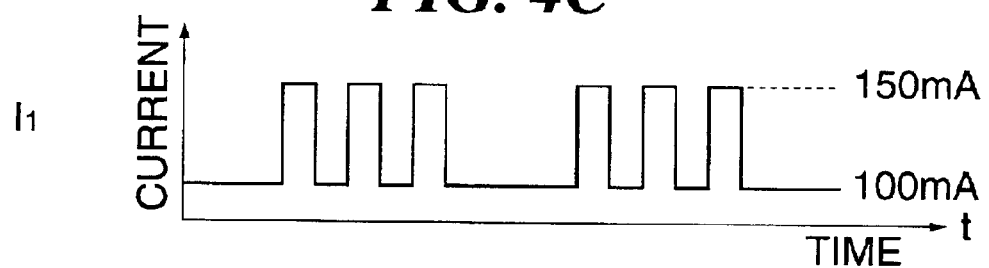
Figure 4D:
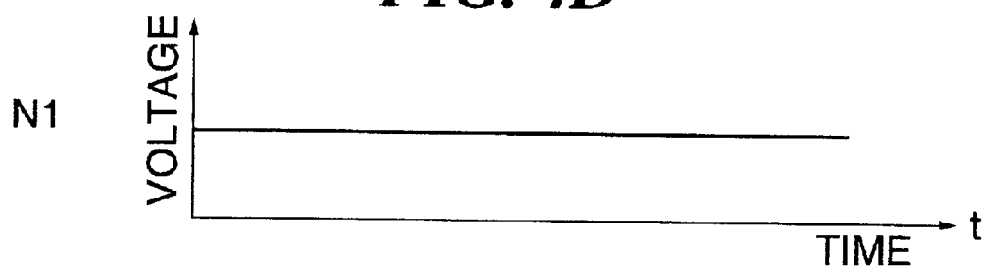

In the above configuration, as shown in FIGS. 4A and 4B, when the first voltage pulse signal SW1 is applied to a gate of the NMOS transistor 22 and the second voltage pulse signal SW1' opposite in phase to the first voltage pulse signal SW1 is applied to a gate of the NMOS transistor 23, the NMOS transistors 22, 23 are switched alternately, i.e. in a complementary manner by the first and second voltage pulse signals SW1, SW1'. Since the current source 20 keeps supplying the 100 mA current to the laser diode 24, this current becomes the offset current. The laser diode 24 is hence supplied with a current I1 (FIG. 4C) which is obtained by superimposing upon this offset current the 50 mA output current from the current source 21 only during the period wherein the NMOS transistor 22 is switched to turn on.

In this embodiment, either one of the NMOS transistors 22, 23 is driven to turn on throughout their switching period, whereby the constant 50 mA current always flows through the node N1, keeping the potential at the node N1 from varying.

Thus, the laser diode driving circuit according to the second embodiment of the present invention causes the constant current to always flow through the node N1 which is a junction between the current source 21 (second current source) and the NMOS transistor 22 (first switch), thus keeping the potential at the node N1 from varying. As a result, the laser diode can be supplied with a high-speed pulse current obtained by superimposing upon the 100 mA offset current from the current source 20 (first current source) a current pulse obtained from the 50 mA current supplied from the current source 21 by switching the NMOS transistor 22.

Figure 5:
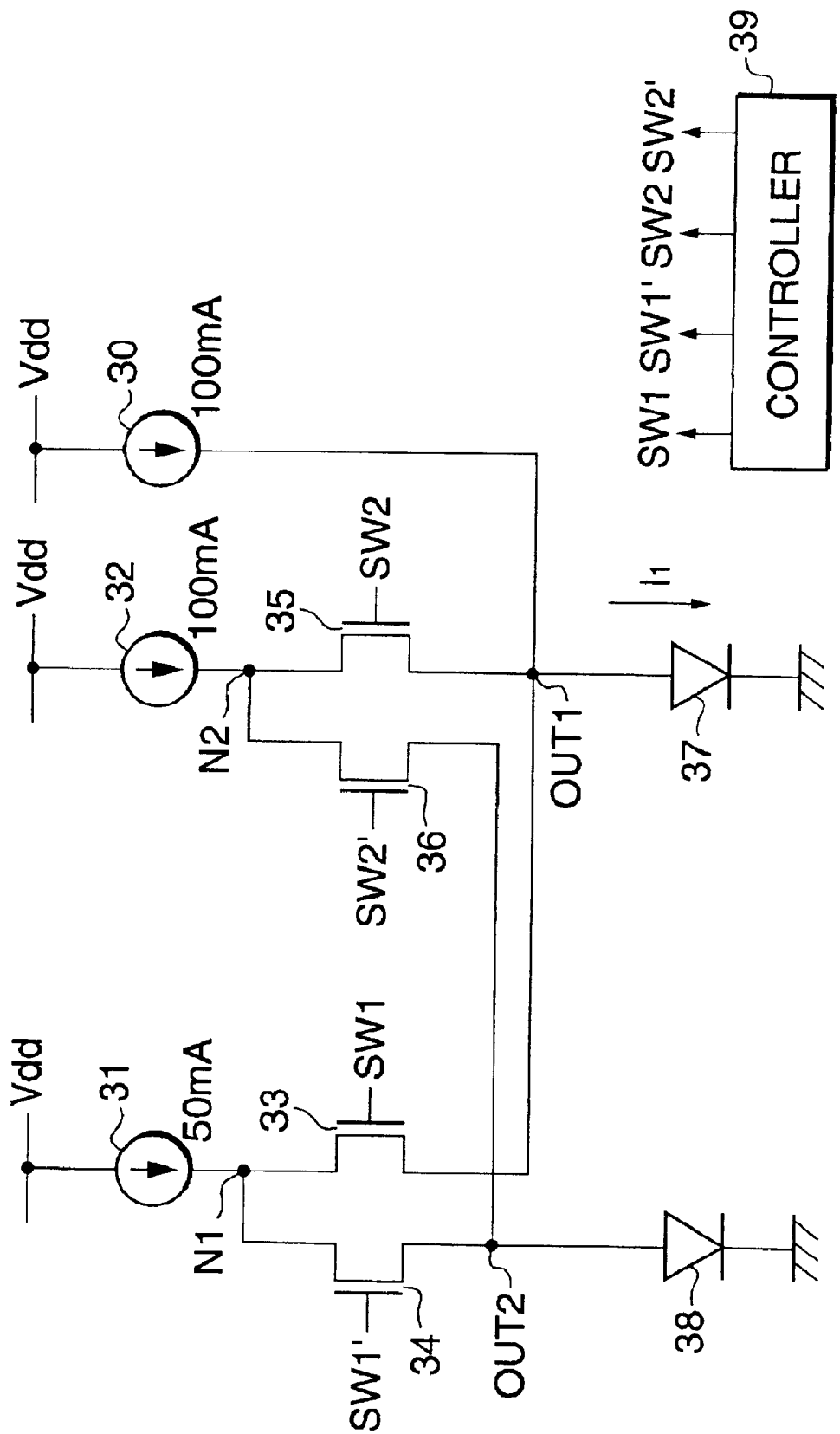
FIG. 5 is a circuit diagram showing the configuration of a laser diode driving circuit according to a third embodiment of the present invention.

Next, FIG. 5 shows the configuration of a laser diode driving circuit according to a third embodiment of the present invention. In the figure, the laser diode driving circuit according to this embodiment is comprised of a current source 30 as a first current source connected to an anode of a laser diode 37 whose cathode is grounded, for supplying the laser diode 37 with an offset current, and two or more (two in this embodiment) current sources 31, 32 as second current sources that supply currents for superimposition upon the offset current.

Further, NMOS transistors 33, 35 as first switches are connected between outputs of the current sources 31, 32 and the anode of the laser diode 37, and NMOS transistors 34, 36 as second switches are connected between nodes N1, N2 and a pseudo load 38, respectively, the nodes N1, N2 being junctions between the outputs of the current sources 31, 32 and the NMOS transistors 33, 35 as the first switches, respectively.

Inputs of the current sources 30, 31, 32 are connected to a power line supplying a source voltage Vdd, the outputs of the power sources 31, 32 are connected to drains of the NMOS transistors 33, 35, respectively, and sources of the NMOS transistors 33, 35 are connected to the anode of the laser diode 37.

Further, the outputs of the current sources 31, 32 are also connected to drains of the NMOS transistors 34, 36, whose sources are grounded through the pseudo load 38. In this embodiment, the output current from the current source 30 is 100 mA, that from the current source 31 is 50 mA, and that from the current source 32 is 100 mA. The pseudo load 38 has a DC resistance substantially equal to that of the laser diode 37.

It is designed such that voltage pulse signals SW1, SW1' which are opposite in phase to each other are applied, respectively, to gates of the NMOS transistors 33, 34 by a controller 39, and voltage pulse signals SW2, SW2' which are opposite in phase to each other are applied, respectively, to gates of the NMOS transistors 35, 36 by the controller 39.

Figure 6:
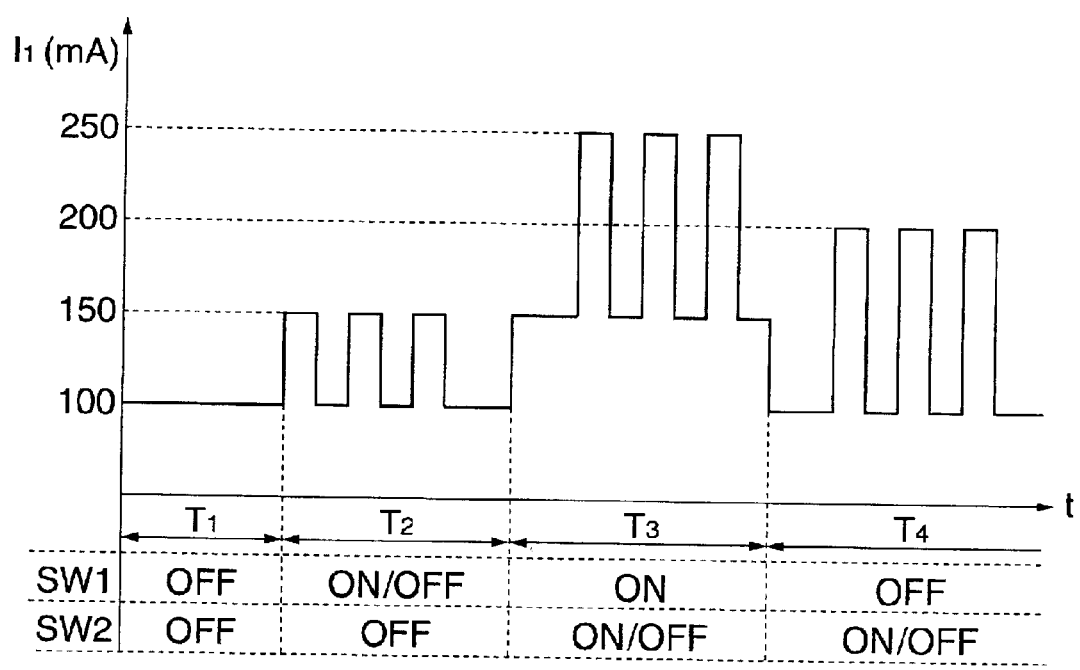
FIG. 6 is a timing chart showing showing the relationship between control signals applied to switching elements and changes in a driving current supplied to a laser diode, in the laser diode driving circuit shown in FIG. 5.

In the above configuration, the voltage pulse signals SW1, SW2 are to be controlled in time sequence at intervals T1–T4 as shown in the lower part of FIG. 6, where "OFF" as to SW1 means that such a low-level signal SW1 as to turn off the NMOS transistor 33 is applied to its gate; "ON" as to SW1 means that such a high-level signal SW1 as to turn on the NMOS transistor 33 is applied to its gate; "ON/OFF" as to SW1 means that such high- and low-level signals SW1 as to turn on and off the NMOS transistor 33 are applied to the gate alternately. This applies similarly to the signal SW2 for driving the NMOS transistor 35.

As shown in FIG. 6, low-level signals are applied to the gates of the NMOS transistors 33, 35 as the signals SW1, SW2 during the interval T1, while the signals SW1', SW2' applied to the gates of the NMOS transistors 34, 36 assume the high level during the same interval. As a result, the NMOS transistors 33, 35 turn off, and the NMOS transistors 34, 36 turn on, whereby the output currents from the current sources 31, 32 flow into the pseudo load 38 via a node OUT2 during the interval T1. Therefore, the laser diode 37 is supplied only with a 100 mA offset current which is the output current from the current source 30 as a driving current I1.

Then, during the interval T2, the signal SW1 assumes ON/OFF, and the signal SW2 assumes OFF. That is, the NMOS transistors 33, 34 are switched alternately in a complementary manner, while the NMOS transistor 35 turns off and the NMOS transistor 36 turns on. As a result, the output current (100 mA) from the current source 32 flows to the pseudo load 38, and the laser diode 37 is supplied with the driving current I1 which is obtained by superimposing upon the 100 mA offset current from the current source 30 a pulse current whose amplitude is 50 mA obtained from the output current supplied from the current source 31 by switching the NMOS transistors 33, 34.

Further, during the interval T3, the signal SW1 assumes ON, and the signal SW2 assumes ON/OFF. That is, the NMOS transistor 33 turns on, the NMOS transistor 34 turns off, and the NMOS transistors 35, 36 are switched alternately in a complementary manner. As a result, the output currents from the current sources 30, 31 are supplied to the laser diode 37 as a 150 mA offset current, whereby the laser diode 37 is supplied with the driving current I1 which is obtained by superimposing upon this offset current a pulse current whose amplitude is 100 mA obtained from the output current supplied from the current source 32 by switching the NMOS transistors 35, 36.

Next, during the interval T4, the signal SW1 assumes OFF, and the signal SW2 assumes ON/OFF. That is, the NMOS transistor 33 turns off, the NMOS transistor 34 turns on, and the NMOS transistors 35, 36 are switched alternately in a complementary manner. As a result, the output current from the current source 30 is supplied to the laser diode 37 as a 100 mA offset current, whereby the laser diode 37 is supplied with the driving current I1 which is obtained by superimposing upon this offset current a pulse current whose amplitude is 100 mA obtained from the output current supplied from the current source 32 by switching the NMOS transistors 35, 36.

In the laser diode driving circuit according to this embodiment, the constant currents always flow through the nodes N1, N2 on the side of the outputs of the current sources 31, 32, respectively, thus keeping the potentials at the nodes N1, N2 from varying. This is why the high-speed pulse current can be supplied to a node OUT1, to which the anode of the laser diode 37 is connected, by switching the NMOS transistors 33, 34 or the NMOS transistors 35, 36 complementarily.

Thus, according to the laser diode driving circuit of this embodiment, the driving current supplied to the laser diode 37 is obtained by superimposing a pulse current signal upon at least an offset current as a reference level supplied from the current source 30 as the first current source, and the driving of the NMOS transistors 33 to 36 connected to the outputs of the respective current sources 31, 32 as the two or more second current sources is controlled such that the amplitude of the pulse current signal is variable. Therefore, the laser diode can be supplied with the driving current wherein the amplitude-variable, high-speed pulse current is superimposed upon the offset current.

Further, according to the laser diode driving circuit of this embodiment, the driving of the NMOS transistors 33 to 36 connected to the outputs of the respective current sources 31, 32 as the two or more second current sources is controlled such that the current supplied to the laser diode is obtained by first superimposing a second offset current upon the level of the first offset current supplied from the current source 30 as the first current source, and then superimposing a pulse current signal upon the resulting offset current as a second reference level which is increased by the first superimposition. Therefore, the current supplied to the laser diode can be controlled such that the offset current level is variable and the high-speed pulse current signal is superimposed upon this variable offset current.

Figure 7:
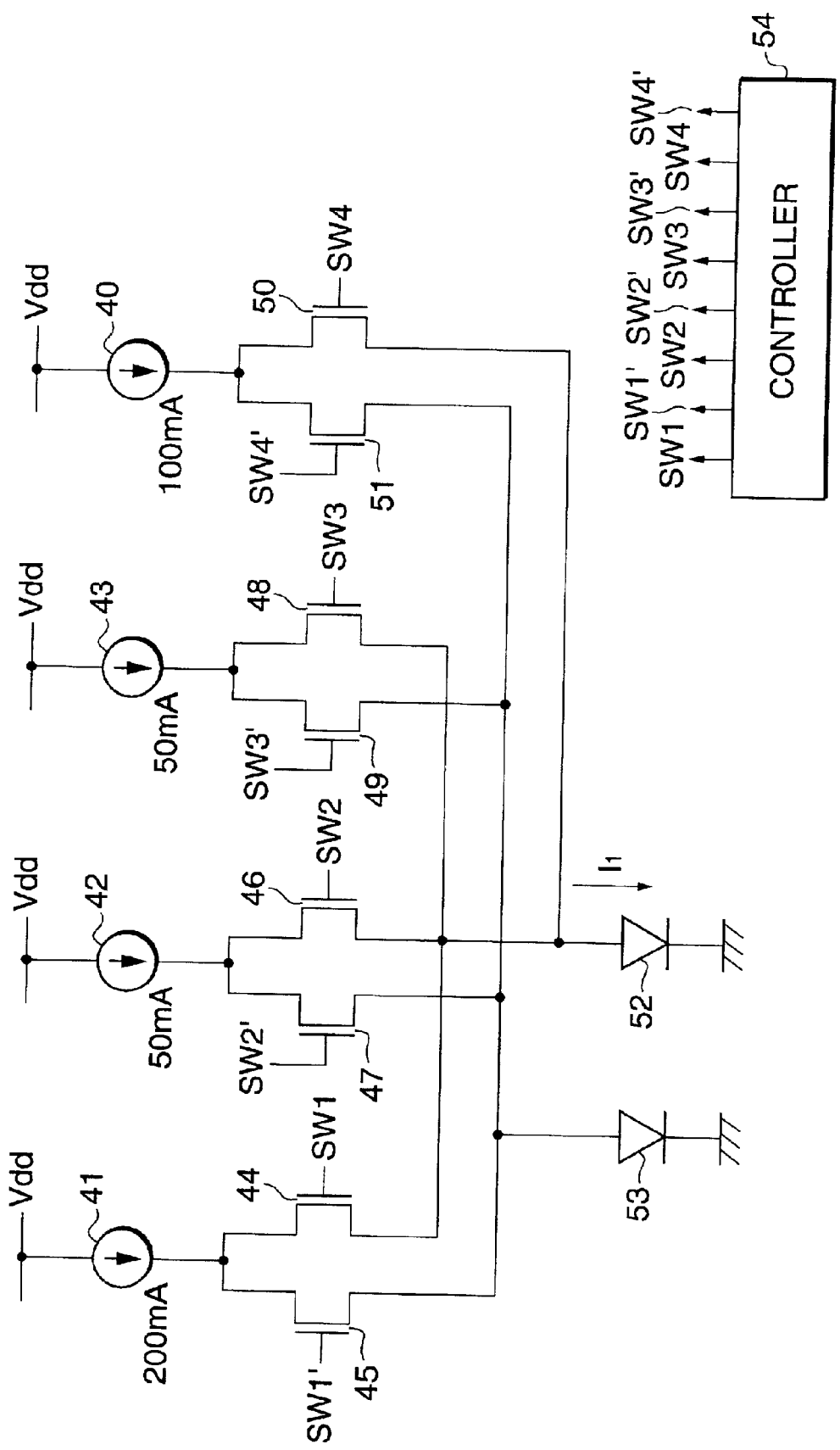
FIG. 7 is a circuit diagram showing a specific example of the configuration of the laser diode driving circuit according to the third embodiment.

Next, FIG. 7 shows an example of the configuration of a specific circuit in which a laser diode driving circuit according to the third embodiment of the present invention is applied to an apparatus for recording/reproducing a recording medium such as a CD-RW (CD-Rewritable). In the figure, this laser diode driving circuit is comprised of a current source 40 connected to an anode of a laser diode 52 whose cathode is grounded, through an NMOS transistor 50 and connected to a pseudo load 53 through an NMOS transistor 51, for normally supplying an offset current to the laser diode 52, and a plurality of current sources 41, 42, 43 that supply currents for superimposition upon the offset current.

NMOS transistors 44, 46, 48 as first switches are connected between respective outputs of the plurality of current sources 41, 42, 43 and the anode of the laser diode 52, and NMOS transistors 45, 47, 49 as second switches are connected between respective nodes N1 to N3 and the pseudo load 53, the nodes N1 to N3 being junctions between the outputs of the current sources 41, 42, 43 and the NMOS transistors 44, 46, 48, respectively. The output currents from the current sources 40, 41, 42, 43 are 100 mA, 200 mA, 50 mA and 50 mA, respectively.

Of the currents supplied to the laser diode 52 for operations of writing, reading and erasing data, offset currents or pulse currents for superimposition upon the offset currents are different in amplitude for the respective operations. Thus, the laser diode driving circuit shown in FIG. 7 causes a controller 54 to supply, to gates of the NMOS transistors 44 to 51, voltage pulse signals SW1 to SW4 and inverted signals SW1' to SW4' thereof for controlling the same transistors 44 to 51 such that the currents supplied to the laser diode 52 are suited to the above operations.

Figure 8:
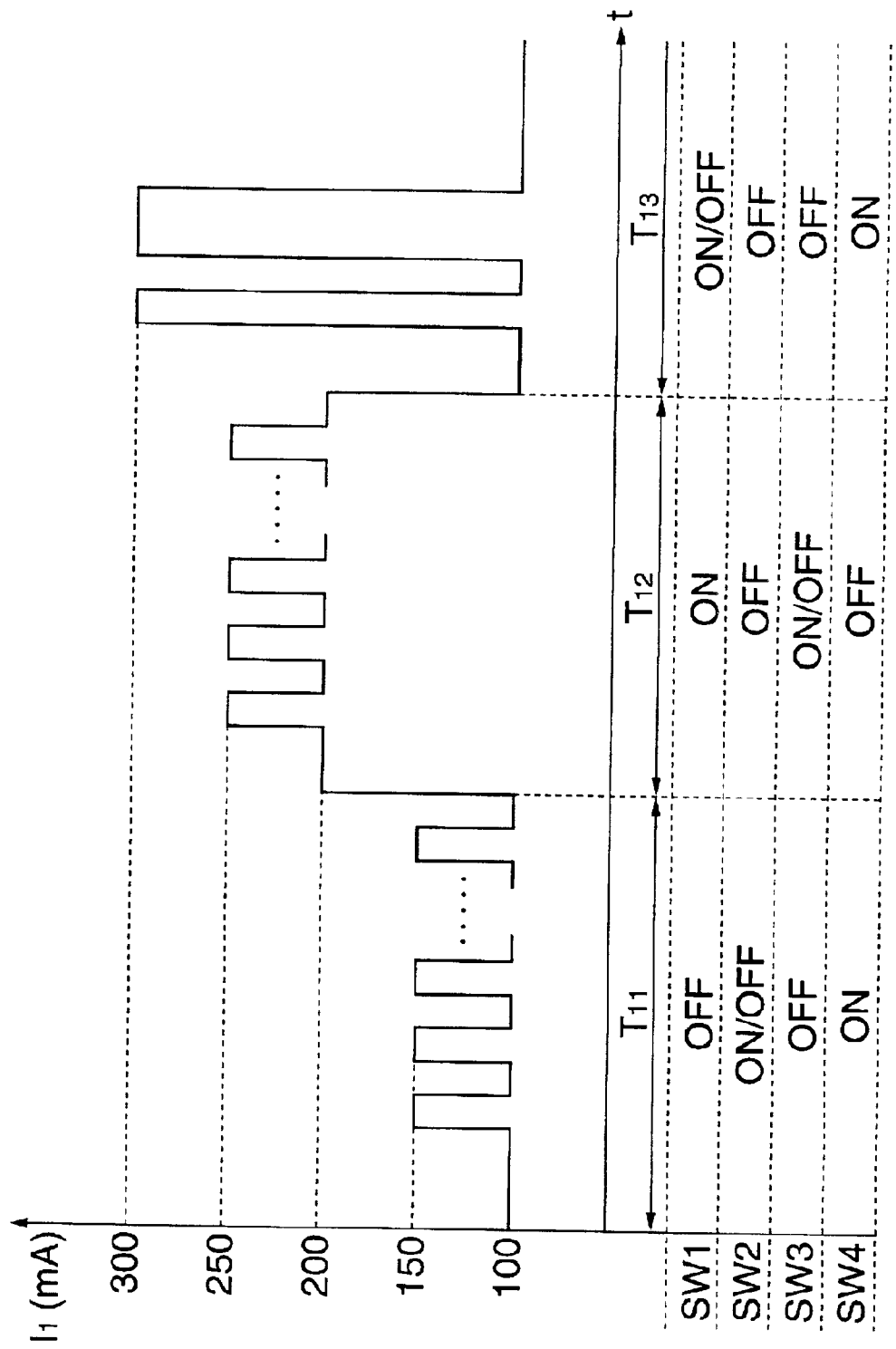
FIG. 8 is a timing chart showing the relationship between control signals applied to switching elements and changes in a driving current supplied to a laser diode, in the laser diode driving circuit shown in FIG. 7.

The operation of the laser diode shown in FIG. 7 will hereinafter be described with reference to a timing chart shown in FIG. 8. As shown in the lower part of FIG. 8, during an interval T11 for reading the data, the voltage pulse signal SW1 supplied to the gate of the NMOS transistor 44 assumes OFF, i.e. it is held at a low level, while the voltage pulse signal SW2 assumes ON/OFF, i.e. it is supplied to the NMOS transistor 46 so that such high- and low-level signals as to turn the same transistor 46 on and off are alternately applied to its gate. Further, the voltage pulse signal SW3 assumes OFF, i.e. it is held at the low level, and the voltage pulse signal SW4 assumes ON, i.e. it is held at a high level.

As a result, during the interval T11, the NMOS transistors 44, 48, 51 are held in an off state, the NMOS transistors 45, 49, 50 are held in an on state, and the NMOS transistors 46, 47 turn on and off alternately in a complementary manner. Therefore, the laser diode 52 is supplied with the output current from the current source 40 (100 mA) as an offset current, while the output currents from the current sources 41, 43 flow into the pseudo load 53.

Further, simultaneously therewith, the output current (50 mA) from the current source 42 is supplied to the laser diode 52 in the form of a pulse current whose amplitude is 50 mA obtained by switching the NMOS transistors 46, 47 complementarily. Therefore, the laser diode 52 is supplied with a driving current I1 wherein the pulse current whose amplitude is 50 mA is superimposed upon the 100 mA offset current.

Next, during an interval T12 for erasing the data, the voltage pulse signal SW1 assumes ON, i.e., it is held at the high level, and the voltage pulse signals SW2, SW4 assume OFF, i.e. they are held at the low level. Further, the voltage pulse signal SW3 assumes ON/OFF, i.e. it is supplied to the NMOS transistor 48 such that high- and low-level signals are alternately applied to its gate to turn the same transistor 48 on and off. As a result, during the interval T12, the NMOS transistors 44, 47, 51 are held in the on state, the NMOS transistors 45, 46, 50 are held in the off state, and the NMOS transistors 48, 49 turn on and off alternately in a complementary manner.

Therefore, the laser diode 52 is supplied with the output current (200 mA) from the current source 41 as an offset current, while the output currents from the current sources 40, 42 flow into the pseudo load 53. Further, simultaneously therewith, the output current (50 mA) from the current source 43 is supplied to the laser diode 52 in the form of a pulse current whose amplitude is 50 mA obtained by switching the NMOS transistors 48, 49 complementarily. Therefore, the laser diode 52 is supplied with the driving current I1 wherein the pulse current whose amplitude is 50 mA is superimposed upon the 200 mA offset current.

Further, during a period T13 for writing the data, the voltage pulse signal SW1 assumes ON/OFF, i.e. it is supplied to the NMOS transistor 44 such that high- and low-level signals are alternately applied to its gate to turn the same transistor 44 on and off. Further, the voltage pulse signals SW2, SW3 assume OFF, i.e. they are held at the low level, and the voltage pulse signal SW4 assumes ON, i.e. it is held at the high level. As a result, during the interval T13, the NMOS transistors 47, 49, 50 are held in the on state, the NMOS transistors 46, 48, 51 are held in the off state, and the NMOS transistors 44, 45 turn on and off alternately in a complementary manner.

Therefore, the laser diode 52 is supplied with the output current (100 mA) from the current source 40 as an offset current, while the output currents from the current sources 42, 43 flow into the pseudo load 53. Further, simultaneously therewith, the output current (200 mA) from the current source 41 is supplied to the laser diode 52 in the form of a pulse current whose amplitude is 200 mA obtained by switching the NMOS transistors 44, 45 complementarily. Therefore, the laser diode 52 is supplied with the driving current I1 wherein the pulse current whose amplitude is 200 mA is superimposed upon the 100 mA offset current.

During the above operations, the constant currents always flow through the nodes N1 to N4, respectively, keeping the voltages at these nodes from varying, and hence the laser diode 52 can be supplied with a high-speed pulse current similarly to the already described third embodiment.

Figure 9:
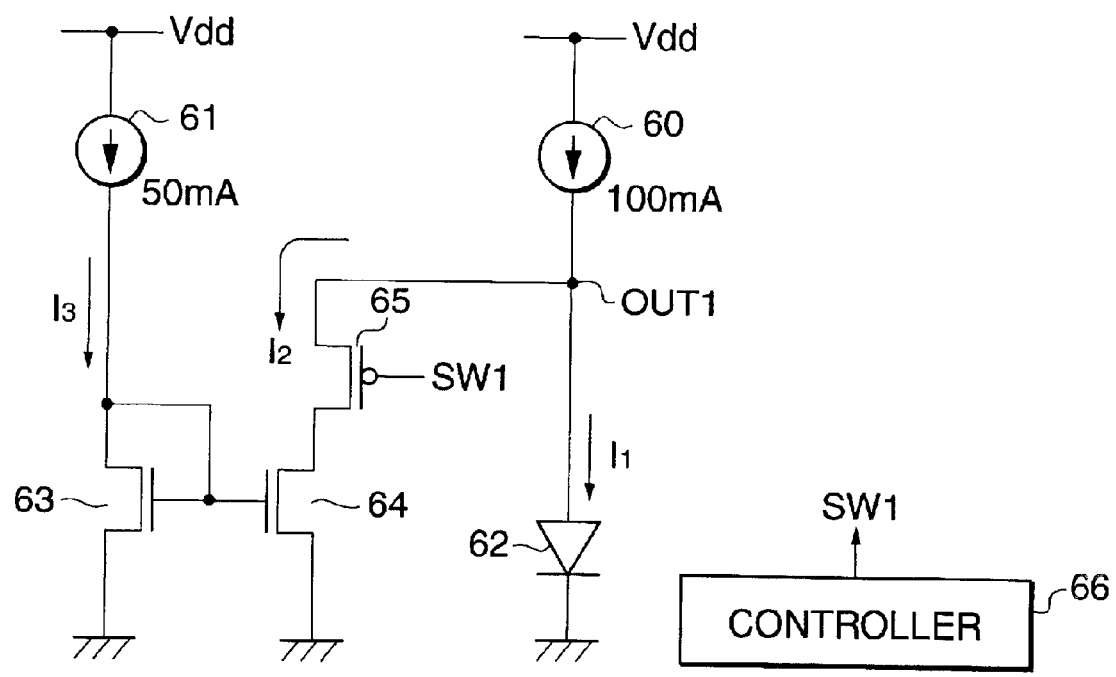
FIG. 9 is a circuit diagram showing the configuration of a laser diode driving circuit according to a fourth embodiment of the present invention.

Next, FIG. 9 shows the configuration of a laser diode driving circuit according to a fourth embodiment of the present invention. In the figure, the laser diode driving circuit according to this embodiment is comprised of a current source 60 as a first current source connected to an anode of a laser diode 62 whose cathode is grounded, for supplying an offset current to the laser diode 62, a current source 61 as a second current source that supplies an output current whose value is different from that supplied by the current source 60, a current mirror circuit having an NMOS transistor 63 as a first transistor for sinking the output current from the current source 61 and an NMOS transistor 64 as a second transistor driven by the NMOS transistor 63, an NMOS transistor 65 as a switch connected between the NMOS transistor 64 and a node OUT1 which is a junction between an output of the current source 60 and the anode of the laser diode 62, and a controller 66 that supplies a voltage pulse signal SW1 to the NMOS transistor 65.

The output currents from the current sources 60, 61 are 100 mA and 50 mA, respectively, and the channel widths of the NMOS transistors 63, 64 are supposed to be equal to each other. Further, the NMOS transistor 65 is controlled by the voltage pulse signal SW1 shown in FIG. 10A for switching operation.

Figure 10A:
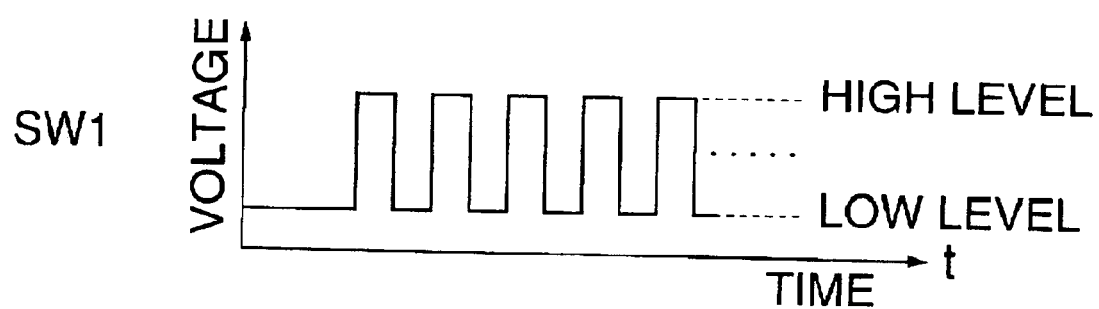
FIGS. 10A and 10B collectively form a timing chart showing showing the relationship between a control signal applied to a switching element and changes in a driving current applied to a laser diode, in the laser diode driving circuit shown in FIG. 9.

In the above configuration, during a period in which the voltage pulse signal SW1 shown in FIG. 10A is at a low level, the NMOS transistor 65 is in an off state, whereby all the output current (100 mA) is supplied to the laser diode 62 as a driving current I1.

Figure 10B:
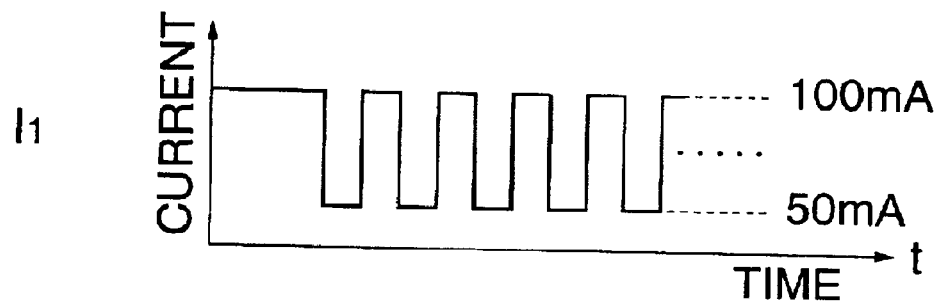

On the other hand, during a period in which the same signal SW1 is at a high level, the NMOS transistor 65 is in an on state. At this instance, the NMOS transistor 63 is supplied with a constant current I3 (50 mA) from the current source 61, and sinks it. Having the same channel width as the NMOS transistor 63, the NMOS transistor 64 is likewise supplied with a 50 mA current I2 from the current source 60 through the NMOS transistor 65. As a result, during a period in which the NMOS transistor 65 is in the on state, the laser diode 62 is supplied with a 50 mA current from the current source 60 as the driving current I1. Therefore, responsive to the switching of the NMOS transistor 65 by the voltage pulse signal SW1, the laser diode 62 is supplied with such a driving current I1 as shown in FIG. 10B.

According to the laser diode driving circuit of this embodiment, the 100 mA constant current always flows through the node OUT1 to keep the voltage at the node OUT1 from varying, and additionally the current mirror circuit comprised of the NMOS transistors 63, 64 is highly responsive. This arrangement allows a predetermined amount (50 mA) of the output current from the current source 60 as the first current source to be intermittently shunted to the current mirror circuit by switching the NMOS transistor 65 using the offset current (100 mA) from the current source 60 as a reference, whereby a high-speed pulse current is obtained. Hence, the laser diode can be supplied with such a high-speed pulse current.

Figure 11:
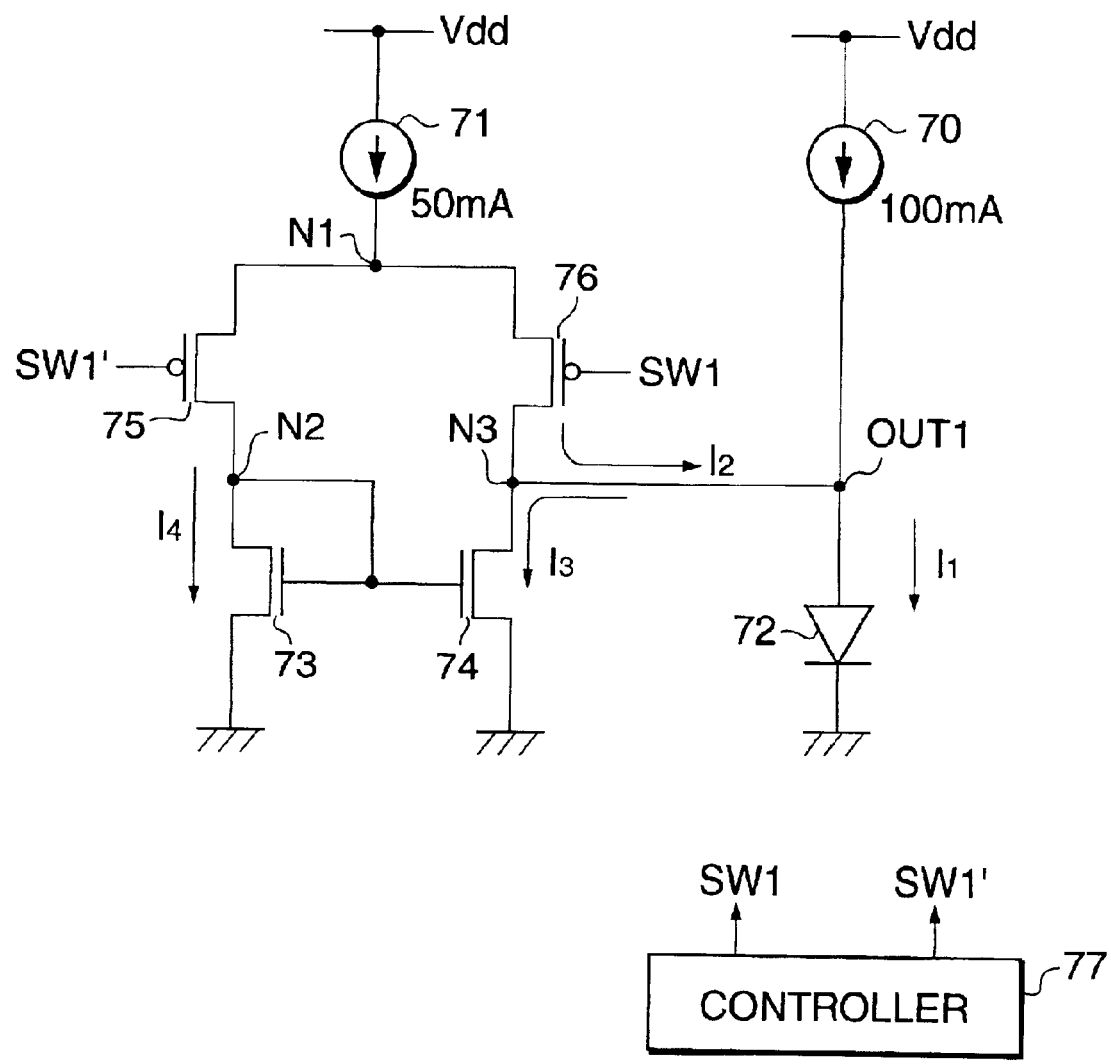
FIG. 11 is a circuit diagram showing the configuration of a laser diode driving circuit according to a fifth embodiment of the present invention.

Next, FIG. 11 shows the configuration of a laser diode driving circuit according to a fifth embodiment of the present invention. In the figure, the laser diode driving circuit according to this embodiment is comprised of a current source 70 as a first current source connected to an anode of a laser diode 72 whose cathode is grounded, for supplying an offset current to the laser diode 72, a current source 71 as a second current source that supplies an output current whose value is different from that supplied from the first current source, a current mirror circuit having an NMOS transistor 73 as a first transistor for sinking the output current from the current source 71 and an NMOS transistor 74 as a second transistor driven by the NMOS transistor 73, a PMOS transistor 75 as a first switch connected between an output of the current source 71 and the NMOS transistor 73, a PMOS transistor 76 as a second switch connected between the same output and the NMOS transistor 74, and a controller 77 that supplies voltage pulse signals SW1', SW1 to the PMOS transistors 75, 76, respectively.

The output currents from the current sources 70, 71 are 100 mA and 50 mA, respectively, and the channel widths of the NMOS transistors 73, 74 are supposed to be equal to each other. Further, an output of the current source 70 is connected to a node N3 which is a junction between the PMOS transistor 76 as the second switch and the NMOS transistor 74, and the driving of the PMOS transistors 76, 75 as the second and first switches is controlled by the voltage pulse signals SW1, SW1' shown in FIGS. 12A and 12B such that the same transistors 76, 75 switch in a complementary manner.

Figure 12A:
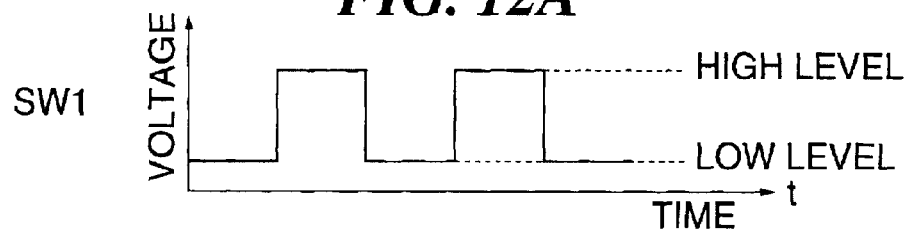
FIGS. 12A to 12F collectively form a timing chart showing the operating states of various parts of the laser diode driving circuit shown in FIG. 11.
Figure 12B:
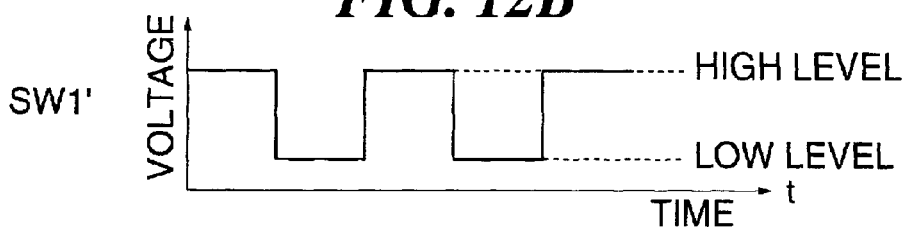
Figure 12C:
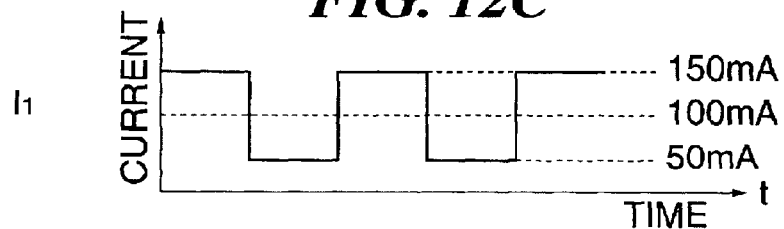
Figure 12D:
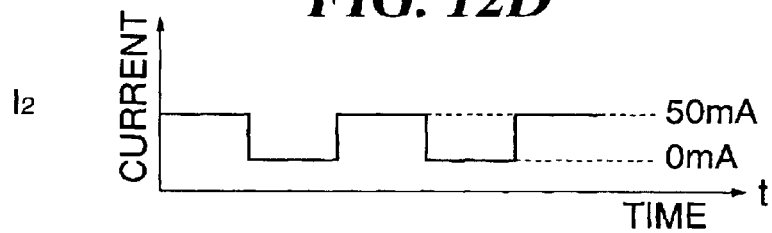

In the above configuration, when the PMOS transistors 76, 75 are driven by the voltage pulse signal SW1, SW1' shown in FIGS. 12A, 12B, the PMOS transistor 76 is in an on state during a period in which the signal SW1 shown in FIG. 12A is at a low level. Since the voltage pulse signal SW1' assumes a high level at this instance, the PMOS transistor 75 turns off. As a result, the NMOS transistors 73, 74 likewise turn off. Therefore, the laser diode 72 is supplied with not only the 100 mA current from the current source 70 at all times, but also a 50 mA current I2 (FIG. 12D) from the current source 71 through the PMOS transistor 76. Thus, the laser diode 72 is supplied with a 150 mA driving current I1 (FIG. 12C) during a period in which the voltage pulse signal SW1 is at the low level.

Figure 12E:
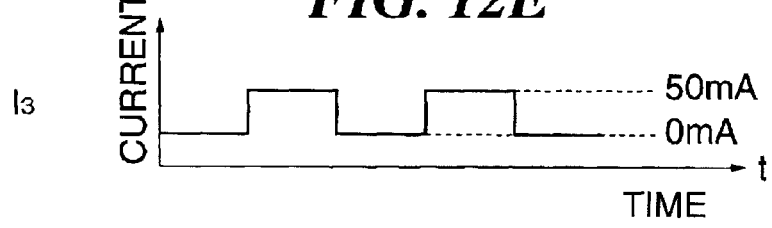
Figure 12F:
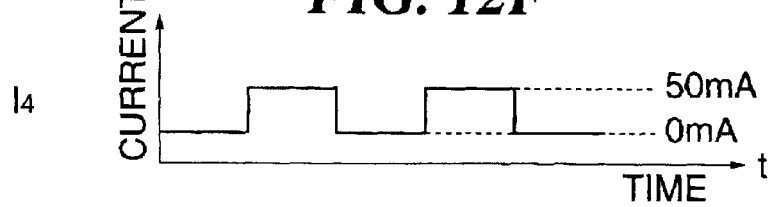

On the other hand, during a period in which the voltage pulse signal SW1 shown in FIG. 12A is at the high level, the PMOS transistor 76 is in an off state. Since the voltage pulse signal SW1' assumes the low level at this instance, the PMOS transistor 75 turn on. In response thereto, the NMOS transistors 73, 74 operate in saturation. As a result, a 50 mA current I4 from the current source 71 is sunk by the NMOS transistor 73 through the PMOS transistor 75 (FIG. 12F), and simultaneously therewith, a 50 mA current I3 having the same value as the current I4 flows through the NMOS transistor 74 from the current source 70 due to these transistors 73, 74 having the same channel width (FIG. 12E).

Therefore, of the 100 mA output current from the current source 70, the 50 mA current I3 shunts toward the current mirror circuit, whereby the laser diode 72 is supplied with the 50 mA driving circuit I1.

Thus, according to the laser diode driving circuit of this embodiment, the laser diode 72 is always supplied with the offset current from the current source 70 as the first current source, and the current from the current source 71 as the second current source is superimposed upon the offset current through the operation of the PMOS transistors 75, 76 as the first and second switches and the current mirror circuit, or a portion of the offset current which is equal to the current supplied from the current source 71, is shunted to the current mirror circuit. As a result, the laser diode can be supplied with a high-speed pulse current, and at the same time, such current supplied to the laser diode can have its amplitude varied with respect to a central value of the current which is fixed. Therefore, the designing and adjustment of the laser diode circuit can be facilitated.

Figure 13:
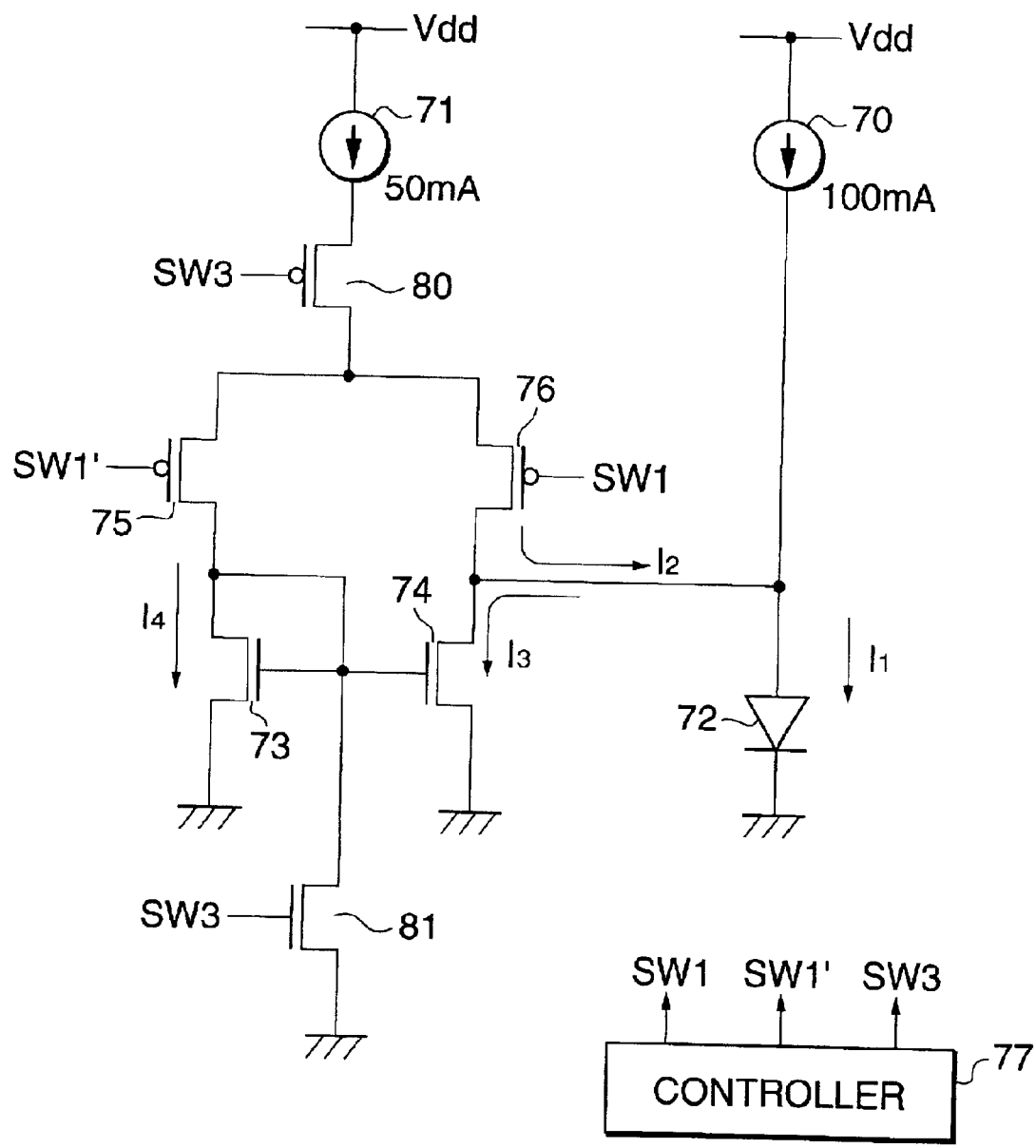
FIG. 13 is a circuit diagram showing the configuration of a laser diode driving circuit according to a sixth embodiment of the present invention.

Next, FIG. 13 shows the configuration of a laser diode driving circuit according to a sixth embodiment of the present invention. The laser diode driving circuit according to this embodiment is different in configuration from that according to the fifth embodiment shown in FIG. 11 in that as shown in FIG. 13, the former is additionally provided with a PMOS transistor 80 as a third switch connected between the output of the current source 71 as the second current source and the PMOS transistors 75, 76 as the first and second switches, for blocking the supply of the current to the same transistors 75, 76, and an NMOS transistor 81 as a fourth switch for forcibly turning off the NMOS transistors 73, 74 as the first and second transistors constituting the current mirror circuit, in order to limit the current supplied to the laser diode 72 only to the offset current supplied from the current source 70 as the first current source. Since the other configurational aspect is the same as that shown in FIG. 11, any duplicate description is omitted with the same components designated by the same reference numerals.

It is arranged such that the controller 77 applies, to gates of the PMOS and NMOS transistors 80, 81, the same control signal SW3 that assumes a low level during normal operation and a high level for blocking the influence of the operations performed by both the current mirror circuit comprised of the NMOS transistors 73, 74 and the PMOS transistors 75, 76 as the first and second switches.

In the above configuration, during normal operation, i.e. while the control signal SW3 is at the low level, the PMOS transistor 80 turns on, and the NMOS transistor 81 turns off. This is the same circuit configuration as that shown in FIG. 11, and thus the voltage pulse signals SW1', SW1 switch the PMOS transistors 75, 76 in a complementary manner to supply the laser diode 72 with the driving current I1 which increases and decreases with an amplitude of 50 mA with respect to the central value of the current fixed at 100 mA.

On the other hand, while the control signal SW3 is at the high level, the PMOS transistor 80 turns off, and the NMOS transistor 81 turns on. As a result, the NMOS transistors 73, 74 and the PMOS transistors 75, 76 turn off, whereby the current I2 flowing from the current source 71 to the laser diode 72, the current I4 from the current source 71 to the NMOS transistor 73, and the current I3 from the current source 70 to the NMOS transistor 74 assume zero.

Thus, during a period in which the control signal SW3 is at the high level, this laser diode driving circuit can block the influence of the operations performed by both the current mirror circuit comprised of the NMOS transistors 73, 74 and the complementarily switching PMOS transistors 75, 76 as the first and second switches, and it is at this instance that the laser diode 72 is supplied with the 100 mA driving current from the current source 70. In this case, it is possible to cause the NMOS transistors 73, 74 constituting the current mirror circuit to quickly switch from the on to the off state by turning on the NMOS transistor 81, but this causes the PMOS transistor 80 to turn off, thereby causing the potential at its source to assume a supply voltage Vdd. This impedes quick response of the PMOS transistor 80 in its switching back to the normal operation.

The laser diode driving circuit according to this embodiment is additionally provided with the PMOS transistor 80 as the third switch connected between the output of the current source 71 and the PMOS transistors 75, 76, for blocking the current supply to the same transistors 75, 76, and the NMOS transistor 81 as the fourth switch for forcibly turning off the NMOS transistors 73, 74 constituting the current mirror circuit, in order to limit the current supplied to the laser diode 72 only to the offset current from the current source 70. As a result, in addition to the effects obtained by the fifth embodiment, the influence of the current mirror circuit can be blocked quickly when the current supplied to the laser diode 72 is limited to the offset current from the first current source.

Figure 14:
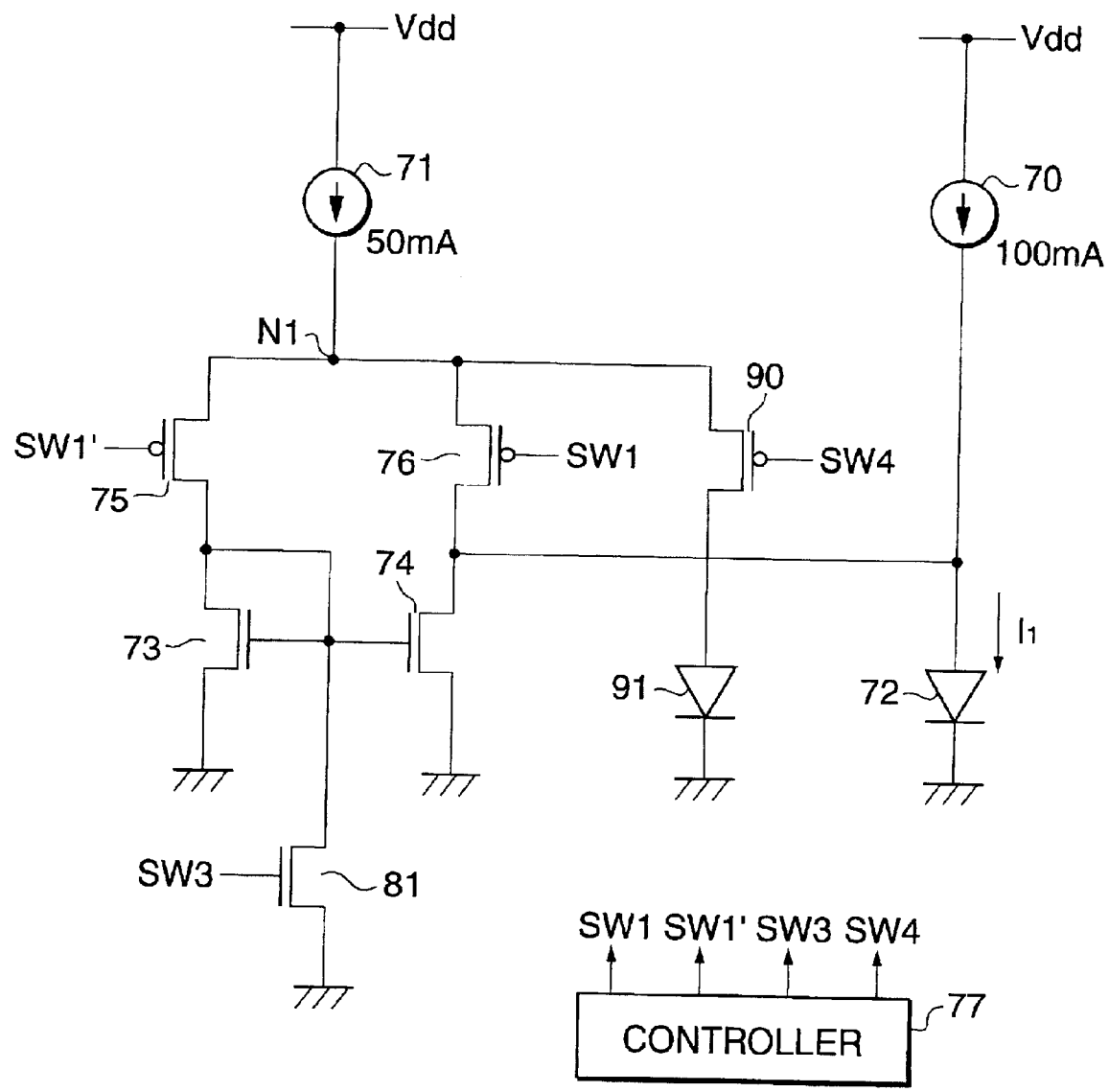
FIG. 14 is a circuit diagram showing the configuration of a laser diode driving circuit according to a seventh embodiment of the present invention.

Next, FIG. 14 shows the configuration of a laser diode driving circuit according to a seventh embodiment of the present invention. The laser diode driving circuit according to this embodiment is different in configuration from that according to the sixth embodiment shown in FIG. 13 in that as shown in FIG. 14, the PMOS transistor 80 as the third switch is eliminated and a PMOS transistor 90 as a fifth switch connected between the output of the current source 71 as the second current source and a pseudo load 91 is provided, whereby the PMOS transistor 90 is turned on to cause the output current from the current source 71 (second current source to flow to the pseudo load 91, in order to limit the current supplied to the laser diode 72 only to the offset current from the current source 70 (first current source). Since the other configurational aspect is the same as that according to the sixth embodiment shown in FIG. 13, any duplicate description is omitted.

Figure 15A:
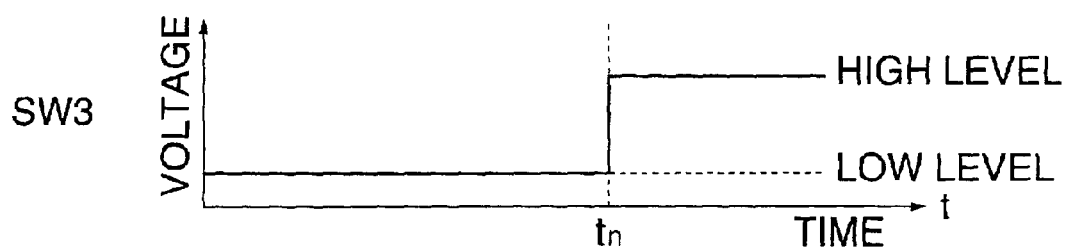
FIGS. 15A to 15C collectively form a timing chart showing the relationship between the operating states of various switching elements and a driving current supplied to a laser diode, in the laser diode driving circuit shown in FIG. 14.
Figure 15B:
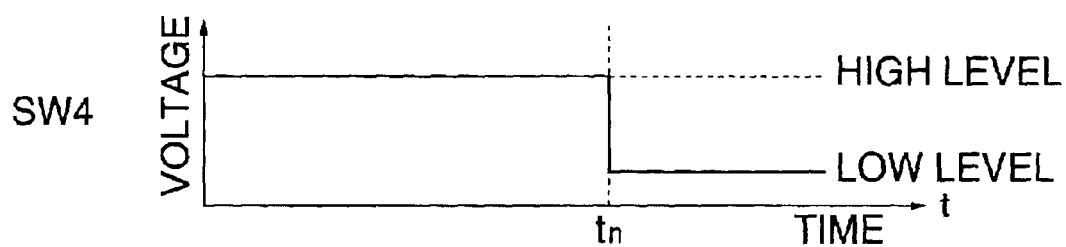
Figure 15C:
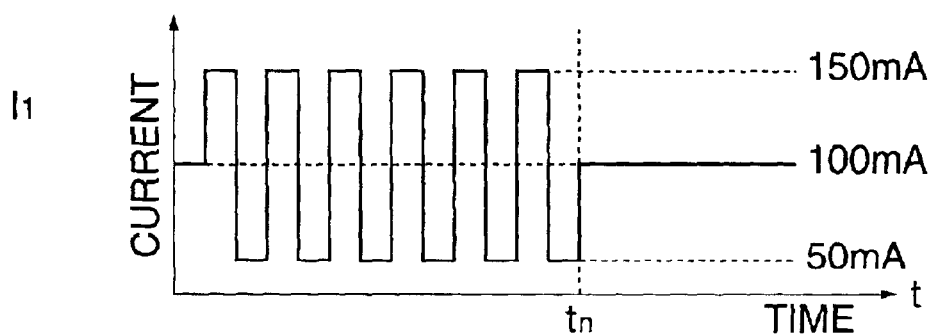
Figure 16:
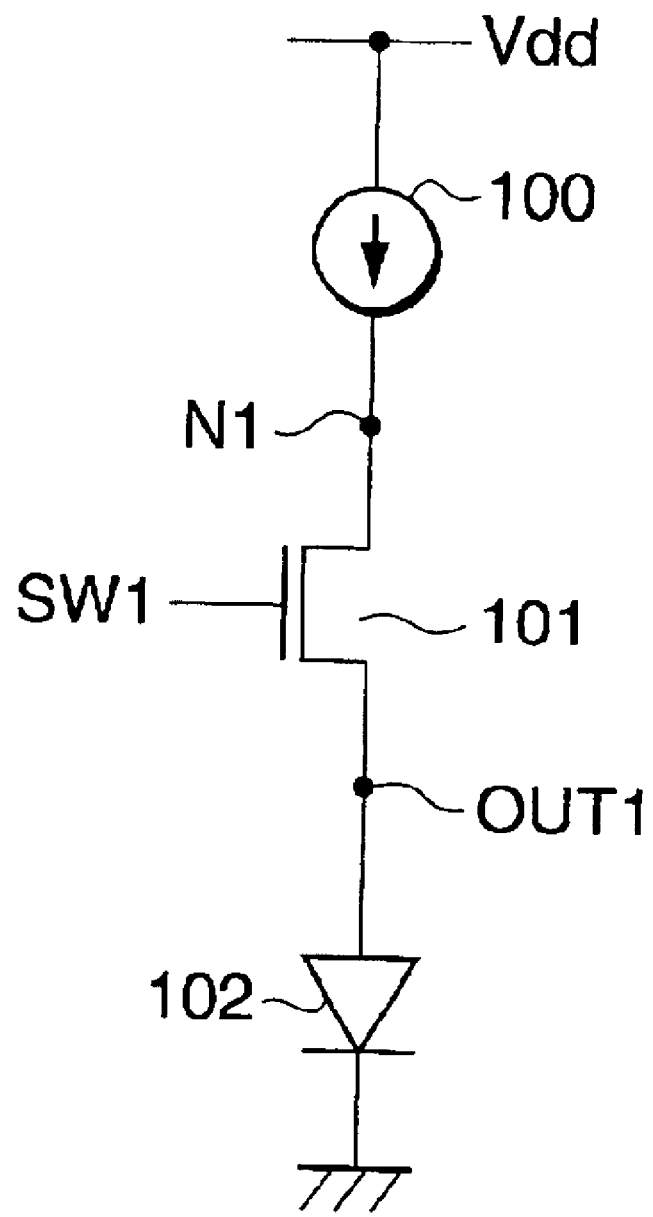
FIG. 16 is a circuit diagram showing the configuration of essential parts of a conventional laser diode driving circuit.
Figure 17A:
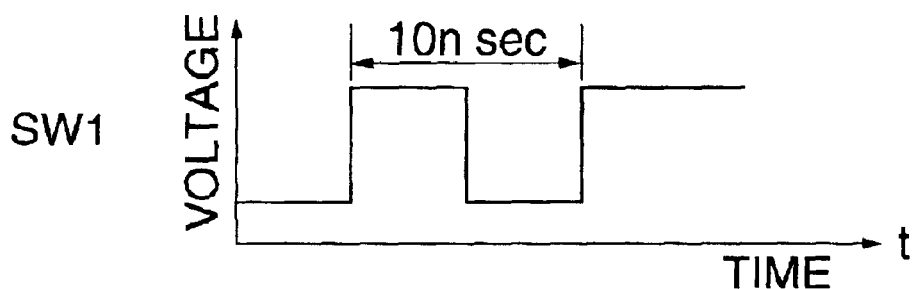
FIGS. 17A to 17C collectively form a timing chart showing the operating states of various parts of the laser diode driving circuit shown in FIG. 16.
Figure 17B:
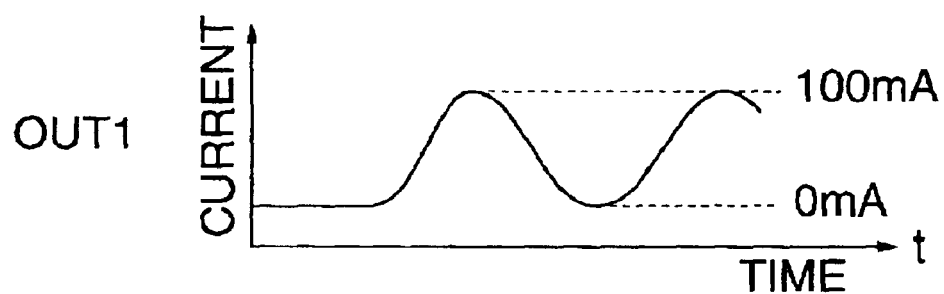
Figure 17C:
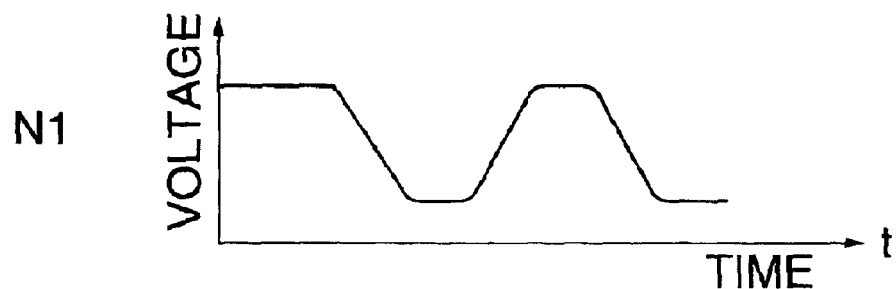
Figure 18:
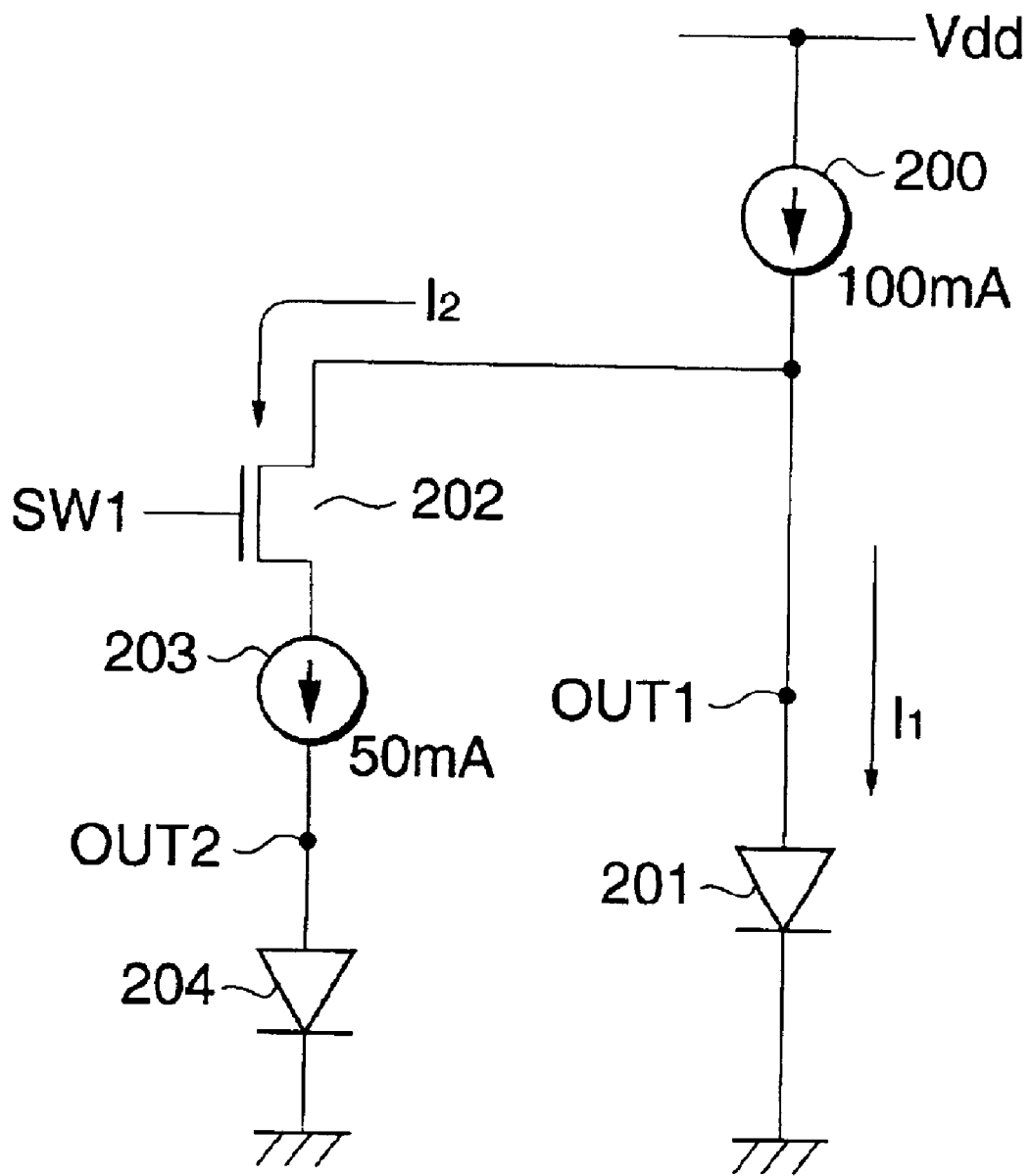
FIG. 18 is a circuit diagram showing the configuration of essential parts of a conventional laser diode driving circuit by way of its main part.
Figure 19A:
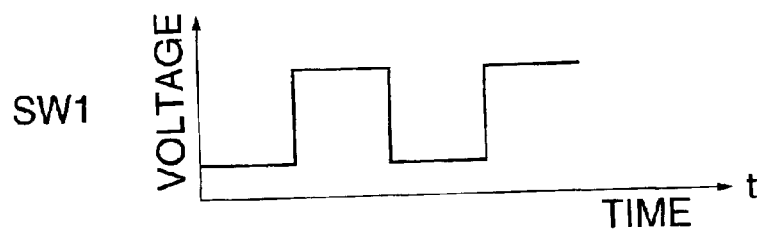
FIGS. 19A to 19D collectively form a timing chart showing the operating states of various parts of the laser diode driving circuit shown in FIG. 18.
Figure 19B:
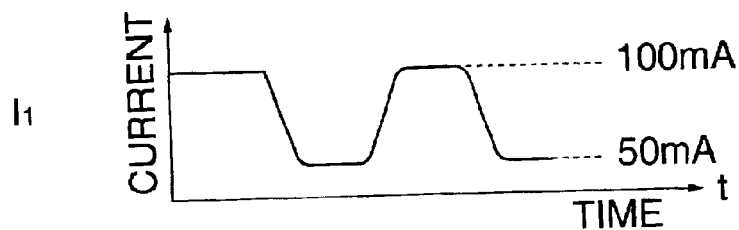
Figure 19C:
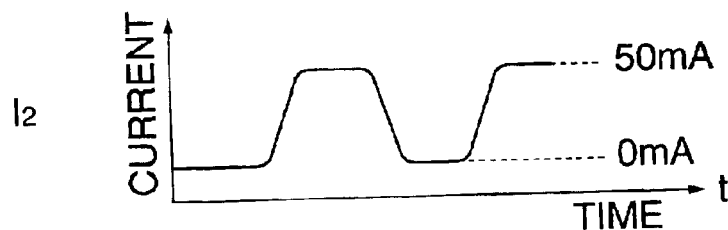
Figure 19D:
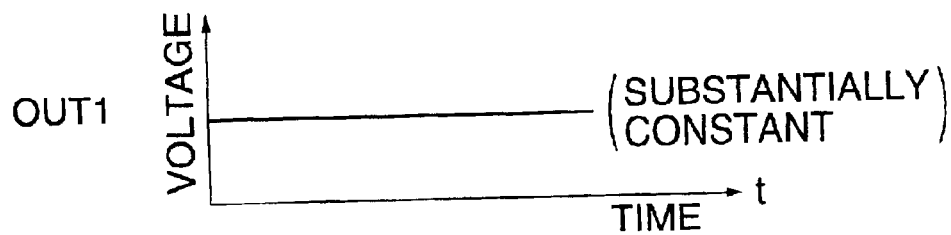

In the above configuration, during normal operation wherein the PMOS transistors 75, 76 are switched complementarily by the voltage pulse signals SW1', SW1 from the controller 77, the control signal SW3 applied to the gate of the NMOS transistor 81 from the controller 77 is at the low level, and a control signal SW4 applied to a gate of the PMOS transistor 90 from the controller 77 assumes a high level (FIGS. 15A and 15B). Under this condition, as shown in FIG. 15C, the laser diode 72 is supplied with the driving current I1 which increases and decreases with an amplitude of 50 mA with respect to the central value of the current fixed at 100 mA.

Then, when the control signal SW4 changes from the high to the low level and the control signal SW3 from the low to the high level at a time point tn, and the voltage pulse signals SW1', SW1 applied to the gates of the PMOS transistors 75, 76 become held at the high-level potential, the output current from the current source 71 flows to the pseudo load 91 through the PMOS transistor 90 in a manner following a bypass, and the PMOS transistors 75, 76 and the NMOS transistors 73, 74 turn off. As a result, the influence of the operations performed by both the PMOS transistors 75, 76 as the switching devices and the current mirror circuit comprised of the NMOS transistors 73, 74 can be blocked at high speed.

Further, the 50 mA constant current always flows through a node N1 which is a junction between the output of the current source 71 as the second current source and sources of the PMOS transistors 75, 76, 90, keeping the voltage at the node N1 from varying.

Therefore, the laser diode driving circuit according to this embodiment can respond quickly to switching from the operating state of limiting the current supplied to the laser diode only to the offset current from the current source 70 as the first current source to the operating state of generating a pulse current either by superimposing the current from the current source 71 as the second current source upon the offset current through the operations of the PMOS transistors 75, 76 as the first and second switches and the NMOS transistors 73, 74 constituting the current mirror circuit, or by shunting a portion of the offset current which is equal in value to the current from the current source 71, to the current mirror circuit.

What is claimed is:

1. A circuit for driving a laser diode having a cathode and an anode, comprising:
  a first current source connected to the anode of said laser diode, the cathode of which is grounded, for supplying an offset current to said laser diode;
  a second current source that supplies a current for superimposition upon said offset current;
  a first switch connected between said second current source and the anode of said laser diode;
  a second switch connected between a junction between said second current source and said first switch and a pseudo load; and
  a controller that supplies a first voltage pulse signal to said first switch and a second voltage pulse signal opposite in phase to said first voltage pulse signal to said second switch to switch said first and second switches in a complementary manner.

2. A circuit for driving a laser diode having a cathode and an anode, comprising:
  a first current source connected between the anode of said laser diode, the cathode of which is grounded, for supplying an offset current to said laser diode;
  at least two second current sources each having an output, for supplying currents for superimposition upon said offset current;
  at least two first switches connected between the outputs of said at least two second current sources and the anode of said laser diode;
  at least two second switches connected between respective junctions between the outputs of said at least two current sources and said first switches and a pseudo load; and
  a controller that controls driving of said at least two first switches and said at least two second switches such that said laser diode is supplied with a current obtained by superimposing a pulse current signal upon at least said offset current as a reference level, and such that an amplitude of said pulse current signal is variable.

3. A circuit for driving a laser diode according to claim 2, wherein said at least two first switches and said at least two second switches are formed of MOS transistors.

4. A circuit for driving a laser diode according to claim 2, wherein said controller controls driving of said at least two first switches and said at least two second switches such that said laser diode is supplied with a current obtained by first superimposing a second offset current upon a level of said offset current to obtain an offset current as a second reference level which is increased by said superimposition, and then superimposing a pulse current signal upon said offset current as the second reference level.

5. A circuit for driving a laser diode having a cathode and an anode, comprising:
  a first current source having an output thereof connected to the anode of said laser diode, the cathode of which is grounded, for supplying an offset current to said laser diode;
  a second current source that supplies an output current whose value is different from that of an output current supplied from said first current source;
  a current mirror circuit having a first transistor for sinking the output current from said second current source, and a second transistor driven by said first transistor;
  a switch connected between said second transistor and a junction between the output of said first current source and the anode of said laser diode; and
  a controller that supplies a voltage pulse signal to said switch.

6. A circuit for driving a laser diode according to claim 5, wherein said first and second transistors and said switch are formed of MOS transistors.

7. A circuit for driving a laser diode having a cathode and an anode, comprising:
  a first current source connected to the anode of said laser diode, the cathode of which is grounded, for supplying an offset current to said laser diode;

a second current source having an output, for supplying an output current whose value is different from that of an output current supplied from said first current source;

a current mirror circuit having a first transistor for sinking the output current from said second current source, and a second transistor driven by said first transistor;

a first switch connected between the output of said second current source and said first transistor;

a second switch connected between the output of said second current source and said second transistor;

said first current source having an output thereof connected to a junction between said second switch and said second transistor; and a controller that controls driving of said first and second switches so as to switch in a complementary manner.

8. A circuit for driving a laser diode according to claim 7, wherein said first and second transistors and said first and second switches are formed of MOS transistors.

9. A circuit for driving a laser diode according to claim 7, further comprising a third switch connected between the output of said second current source and said first and second switches, and a fourth switch connected to said first and second transistors constituting said current mirror circuit, and wherein said controller drives said third switch to block current supply to said first and second switches, and drives said fourth switch to forcibly turn off said first and second transistors, to limit a current supplied to said laser diode only to said offset current from said first current source.

10. A circuit for driving a laser diode according to claim 7, further comprising a fourth switch connected to said first and second transistors constituting said current mirror circuit, and a fifth switch connected between the output of said second current source and a pseudo load, and wherein said controller drives said fourth switch to forcibly turn off said first and second transistors, and turn on said fifth switch to cause the output current from said second current source to flow to said pseudo load, to limit a current supplied to said laser diode only to said offset current from said first current source.

11. A circuit for driving diode means having a cathode and an anode, comprising:

first current source means connected to the anode of said diode means, the cathode of which is grounded, for supplying an offset current to said diode means;

second current source means for supplying a current for superimposition upon said offset current;

first switch means connected between said second current source means and the anode of said diode means;

second switch means connected between a junction between said second current source means and said first switch means and a pseudo load; and control means for supplying a first voltage pulse signal to said first switch means and a second voltage pulse signal opposite in phase to said first voltage pulse signal to said second switch means to switch said first and second switch means in a complementary manner.

12. A circuit for driving diode means having a cathode and an anode, comprising:

first current source means connected between the anode of said diode means, the cathode of which is grounded, for supplying an offset current to said diode means;

at least two second current source means each having an output, for supplying currents for superimposition upon said offset current;

first switch means connected between the outputs of said at least two second current source means and the anode of said diode means;

second switch means connected between respective junctions between the outputs of said at least two current source means and said first switch means and a pseudo load; and control means for controlling driving of said first and second switch means such that said diode means is supplied with a current obtained by superimposing a pulse current signal upon at least said offset current as a reference level, and such that amplitude of said pulse current signal is variable.

13. A circuit for driving diode means having a cathode and an anode, comprising:

first current source means having an output thereof connected to the anode of said diode means, the cathode of which is grounded, for supplying an offset current to said diode means;

second current source means for supplying an output current whose value is different from that of an output current supplied from said first current source means;

current mirror circuit means having a first transistor for sinking the output current from said second current source means, and a second transistor driven by said first transistor;

switch means connected between said second transistor and a junction between the output of said first current source means and the anode of said diode means; and control means for supplying a voltage pulse signal to said switch.

14. A circuit for driving diode means having a cathode and an anode, comprising:

first current source means connected to the anode of said diode means, the cathode of which is grounded, for supplying an offset current to said diode means;

second current source means having an output, for supplying an output current whose value is different from that of an output current supplied from said first current source means;

current mirror circuit having a first transistor for sinking the output current from said second current source means, and a second transistor driven by said first transistor;

first switch means connected between the output of said second current source means and said first transistor;

second switch means connected between the output of said second current source means and said second transistor;

said first current source means having an output thereof connected to a junction between said second switch means and said second transistor; and control means for controlling driving of said first and second switch means so as to switch in a complementary manner.

* * * * *